United States Patent
Hu

(10) Patent No.: US 11,289,511 B2
(45) Date of Patent: Mar. 29, 2022

(54) FERROELECTRIC MEMORY DEVICES WITH REDUCED EDGE LEAKAGE AND METHODS FOR FORMING THE SAME

(71) Applicant: Wuxi Petabyte Technologies Co., Ltd., Wuxi (CN)

(72) Inventor: Yushi Hu, McLean, VA (US)

(73) Assignee: WUXI PETABYTE TECHNOLOGIES CO, LTD., Jiangsu (CN)

( * ) Notice: Subject to any disclaimer, the term of this patent is extended or adjusted under 35 U.S.C. 154(b) by 0 days.

(21) Appl. No.: 16/920,296

(22) Filed: Jul. 2, 2020

(65) Prior Publication Data

US 2022/0005829 A1 Jan. 6, 2022

(51) Int. Cl.
| | | |
|---|---|---|
| *H01L 27/11597* | (2017.01) | |
| *H01L 27/11514* | (2017.01) | |
| *H01L 49/02* | (2006.01) | |
| *H01L 27/11502* | (2017.01) | |
| *H01L 21/28* | (2006.01) | |
| *H01L 29/51* | (2006.01) | |

(52) U.S. Cl.
CPC .. *H01L 27/11597* (2013.01); *H01L 27/11502* (2013.01); *H01L 27/11514* (2013.01); *H01L 28/55* (2013.01); *H01L 28/88* (2013.01); *H01L 28/92* (2013.01); *H01L 29/40111* (2019.08); *H01L 29/516* (2013.01)

(58) Field of Classification Search
CPC ......... H01L 27/11502; H01L 27/11514; H01L 27/11597; H01L 28/55; H01L 28/88; H01L 28/92; H01L 29/40111; H01L 29/516
See application file for complete search history.

(56) References Cited

U.S. PATENT DOCUMENTS

| | | | |
|---|---|---|---|
| 2002/0000585 A1* | 1/2002 | Ozaki | H01L 28/55 257/295 |
| 2003/0057463 A1* | 3/2003 | Otabe | H01L 28/56 257/295 |
| 2013/0062996 A1* | 3/2013 | Udayakumar | H01L 41/318 310/321 |
| 2020/0343265 A1* | 10/2020 | Chang | G11C 11/221 |
| 2021/0035992 A1* | 2/2021 | Chen | H01L 28/60 |

FOREIGN PATENT DOCUMENTS

JP 2013191664 A * 9/2013

* cited by examiner

*Primary Examiner* — Matthew E Warren
(74) *Attorney, Agent, or Firm* — Bayes PLLC

(57) ABSTRACT

Embodiments of ferroelectric memory devices and methods for forming the ferroelectric memory devices are disclosed. In an example, a ferroelectric memory cell includes a first electrode, a second electrode, a ferroelectric layer disposed between the first electrode and the second electrode, and a recess between a side surface of at least one of the first electrode or the second electrode and a side surface of the ferroelectric layer.

19 Claims, 17 Drawing Sheets

102

103

400

500

600

600

700

800

900

1000

1000

FERROELECTRIC MEMORY DEVICES WITH REDUCED EDGE LEAKAGE AND METHODS FOR FORMING THE SAME

BACKGROUND

Embodiments of the present disclosure relate to ferroelectric memory devices and fabrication methods thereof.

Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and great maximum read/write endurance.

BRIEF SUMMARY

Embodiments of ferroelectric memory devices and fabrication methods thereof are disclosed herein.

Embodiments of the present disclosure provide a ferroelectric memory cell. The ferroelectric memory cell includes a first electrode, a second electrode, a ferroelectric layer disposed between the first electrode and the second electrode, and a recess between a side surface of at least one of the first electrode or the second electrode and a side surface of the ferroelectric layer.

In some embodiments, the recess is between a side surface of the first electrode and the side surface of the ferroelectric layer, and a side surface of the second electrode is coplanar with the side surface of the ferroelectric layer.

In some embodiments, the recess is between a side surface of the second electrode and the side surface of the ferroelectric layer, and a side surface of the first electrode is coplanar with the side surface of the ferroelectric layer.

In some embodiments, a respective recess is located between each of the side surfaces of the first and second electrodes and the side surface of the ferroelectric layer.

In some embodiments, the first electrode is a top electrode, and the second electrode is a bottom electrode.

In some embodiments, the first electrode and the second electrode each includes at least one of titanium nitride (TiN), titanium silicon nitride ($TiSiN_x$), titanium aluminum nitride ($TiAlN_x$), titanium carbon nitride ($TiCN_x$), tantalum nitride ($TaN_x$), tantalum silicon nitride ($TaSiN_x$), tantalum aluminum nitride ($TaAlN_x$), tungsten nitride ($WN_x$), tungsten silicide ($WSi_x$), tungsten carbide ($WCN_x$), ruthenium (Ru), ruthenium oxide ($RuO_x$), iridium (Ir), doped polysilicon, transparent conductive oxides (TCO), or iridium oxide ($IrO_x$). In some embodiments, the ferroelectric layer includes at least one of aluminum (Al), hafnium (Hf), zirconium (Zr), oxygen (O), or titanium (Ti).

In some embodiments, the ferroelectric memory cell further includes a passivation layer that at least partially covers at least one of an area of the ferroelectric layer exposed by the recess or the side surface. The passivation layer includes at least one of silicon oxide, silicon nitride, aluminum oxide, $HfO_x$, $ZrO_x$, $AlO_x$, hafnium zirconium oxide ($HfZrO_x$), hafnium silicon oxide ($HfSiO_x$), titanium silicon oxide ($TiSiO_x$), or titanium aluminum oxide ($TiAlO_x$).

Embodiments of the present disclosure provide a ferroelectric memory device, which includes a substrate, a plurality of ferroelectric memory strings, and a recess. The plurality of ferroelectric memory strings extend vertically above the substrate. Each of the ferroelectric memory strings includes a conductor layer, a second electrode, a ferroelectric layer, and a first electrode disposed radially from a center of the ferroelectric memory string in this order. The recess is between a top surface of at least one of the first electrode or the second electrode and a top surface of the ferroelectric layer.

In some embodiments, a respective recess is between each of the top surfaces of the first electrode and the second electrode and the top surface of the ferroelectric layer.

In some embodiments, the recess is between a top surface of the second electrode and the top surface of the ferroelectric layer, and a top surface of the first electrode is coplanar with the top surface of the ferroelectric layer.

In some embodiments, the first electrode and the second electrode each includes at least one of titanium nitride (TiN), titanium silicon nitride ($TiSiN_x$), titanium aluminum nitride ($TiAlN_x$), titanium carbon nitride ($TiCN_x$), tantalum nitride ($TaN_x$), tantalum silicon nitride ($TaSiN_x$), tantalum aluminum nitride ($TaAlN_x$), tungsten nitride ($WN_x$), tungsten silicide ($WSi_x$), tungsten carbide ($WCN_x$), ruthenium (Ru), ruthenium oxide ($RuO_x$), iridium (Ir), doped polysilicon, transparent conductive oxides (TCO), or iridium oxide ($IrO_x$). In some embodiments, the ferroelectric layer includes at least one of aluminum (Al), hafnium (HD, zirconium (Zr), oxygen (O), or titanium (Ti).

In some embodiments, the ferroelectric memory device further includes a passivation layer that at least partially covers at least one of an area of the ferroelectric layer exposed by the recess or the side surface. The passivation layer includes at least one of silicon oxide, silicon nitride, aluminum oxide, $HfO_x$, $ZrO_x$, $AlO_x$, hafnium zirconium oxide ($HfZrO_x$), hafnium silicon oxide ($HfSiO_x$), titanium silicon oxide ($TiSiO_x$), or titanium aluminum oxide ($TiAlO_x$).

Embodiments of the present disclosure further provide a method for forming a ferroelectric memory cell. The method includes the following operations. A stack structure is formed to include a first electrode material layer, a second electrode material layer, and a ferroelectric material layer between the first electrode material layer and the second electric material layer. The stack structure is patterned to form a capacitor structure having a patterned first electrode material layer, a patterned second electrode material layer, and a ferroelectric layer between the patterned first electrode material layer and the patterned second electrode material layer. A recess etch is performed on at least one of the patterned first electrode material layer and the patterned second electrode layer to form the first electrode and the second electrode. A recess is formed between a side surface of at least one of the first electrode or the second electrode and a side surface of the ferroelectric layer.

In some embodiments, the first and second electrode material layers each includes at least one of titanium nitride (TiN) or tantalum nitride (TaN). In some embodiments, patterning the stack structure includes etching the stack structure using an etchant gas having at least one of boron trichloride ($BCl_3$), chlorine ($Cl_2$), fluorine ($F_2$), carbon tetrafluoride ($CF_4$), carbon fluoride ($CHF_x$), sulfur fluoride ($SF_x$), nitrogen fluoride ($NF_x$), nitrogen ($N_2$), or argon (Ar).

In some embodiments, patterning the stack structure includes, using a mask layer over the stack structure as an etch mask, patterning the first electrode material layer, the ferroelectric material layer, and the second electrode material layer to form, respectively, the patterned first electrode material layer, the ferroelectric layer, and the patterned second electrode material layer. In some embodiments, patterning the stack structure also includes, using the mask layer as an etch mask, performing a recess etch on the patterned first electrode material layer to form the first electrode and a respective recess between the side surface of the first electrode and the ferroelectric layer.

In some embodiments, performing the recess etch includes performing the recess etch on the patterned first electrode material layer. Performing the recess etch includes at least one of performing a first recess etch during the patterning of the ferroelectric material layer, or performing a second recess etch during the patterning of the second electrode material layer.

In some embodiments, the patterning of the ferroelectric material layer has a lower etch rate on the patterned first electrode material layer than on the ferroelectric material layer. In some embodiments, the patterning of the second electrode material layer includes an isotropic etching process.

In some embodiments, performing the recess etch includes performing the recess etch on the patterned first electrode material layer, which includes performing the recess etch during the patterning of the second electrode material layer.

In some embodiments, performing the recess etch includes performing the recess etch on the patterned first electrode material layer. Performing the recess etch includes, after a formation of the patterned first electrode material layer, the ferroelectric layer, and the second electrode, trimming the mask layer such that a respective recess is formed between a side surface of the mask layer and the side surface of the patterned first electrode material layer. Performing the recess etch also includes, etching, using the trimmed mask layer as an etch mask, the patterned first electrode material layer to remove a portion of the patterned first electrode material layer exposed by the trimmed mask layer.

In some embodiments, the patterning of the ferroelectric material layer has a lower etch rate on the patterned first electrode material layer than on the ferroelectric material layer. In some embodiments, the etching of the patterned first electrode material layer has a lower etch rate on the ferroelectric layer than on the patterned first electrode material layer.

In some embodiments, performing the recess etch includes performing the recess etch on each of the patterned first and second electrode material layers at the same time to respectively form the first and second electrodes. A respective recess is between a side surface of each of the first and second electrodes and the side surface of the ferroelectric layer.

In some embodiments, the patterning of the ferroelectric material layer has a lower etch rate on the patterned first electrode material layer than on the ferroelectric material layer. In some embodiments, the recess etch includes an isotropic etching process that has a lower etch rate on the ferroelectric layer than on the patterned first and second electrode material layers.

In some embodiments, the side surface of each of the first electrode and the second electrode includes a respective top surface of the first electrode and the second electrode, and a side surface of the ferroelectric layer includes a top surface of the ferroelectric layer, the second electrode, the ferroelectric layer, and the first electrode being disposed radially and outwardly. Patterning the recess etch includes planarizing top surfaces of the first electrode material layer, the second electrode material layer, and the ferroelectric material layer, and retching a top portion of at least one of the first and second electrode material layers. The etching has a slower etch rate on the ferroelectric material layer than on the first and second electrode material layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
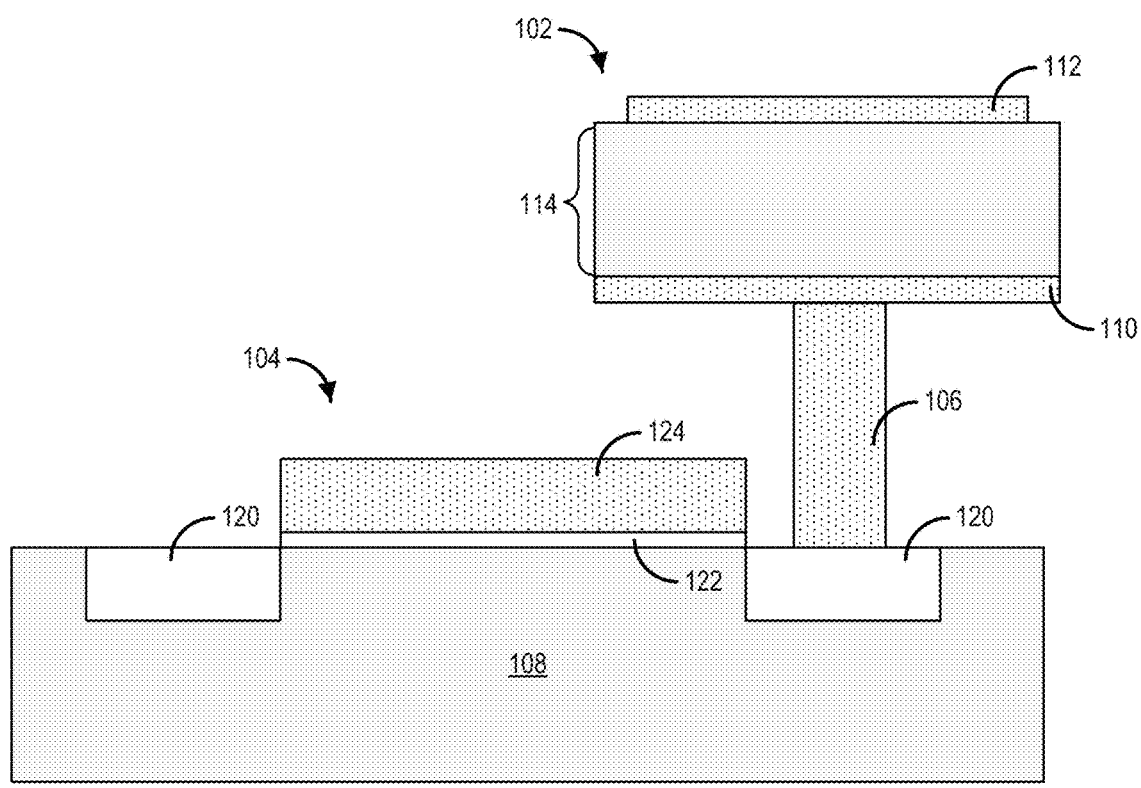
FIG. 1A illustrates a cross-section of an exemplary ferroelectric memory cell, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) memory device" refers to a semiconductor device with vertically oriented strings of memory cell transistors (referred to herein as "memory strings") on a laterally-oriented substrate so that the memory strings extend in the vertical direction with respect to the substrate. As used herein, the term "vertical/vertically" means nominally perpendicular to the lateral surface of a substrate.

As used herein, a "side surface" can generally refer to a surface on the exterior of an object. For example, depending on the embodiment, a side surface can be a sidewall along a horizontal direction (e.g., the x-direction) or a top/bottom surface along a vertical direction (e.g., the z-direction). As used herein, a recess refers to an open space between two boundaries. For example, depending on the embodiment, a recess can be located between two surfaces that are not coplanar with each other, e.g., having a staggered configuration.

One limitation of existing ferroelectric memory device fabrication is process-related damages caused by the various fabrication operations involved in the formation of the ferroelectric memory device. For example, an isolation process often includes operations such as etching and ion implantation processes to form regions and/structures that isolate a ferroelectric memory cell from neighboring structures/devices. These operations can cause damages, e.g., crystalline defects, to the edges of the ferroelectric layer in the ferroelectric memory cell. In another example, contaminations, e.g., chemical contamination caused by wet etching process and plasma contamination caused by dry etching process, resulted from the various operations for forming ferroelectric memory, can alter the physical and/or electrical properties of the ferroelectric layer in these defective regions, resulting in edge leakage. Also, after the formation of the memory cell, edges of the memory cell are susceptible to contaminant diffusion caused by moisture, hydrogen, oxygen, metallic dopants, etc., causing degradation of the material property of edges. The performance of the ferroelectric memory cell can be impaired, e.g., to have higher leakage current and/or reduced capacitance.

Various embodiments in accordance with the present disclosure provide ferroelectric memory devices with reduced edge leakage. In the capacitor structures (e.g., memory cells) disclosed in the present disclosure, electrical coupling between electrodes is reduced in the defective regions on the edges of the respective ferroelectric layer, thus reducing leakage current in the edges of the ferroelectric layer. In various embodiments, a capacitor structure has a recess between the side surface (e.g., sidewall or top surface) of the ferroelectric layer and at least one of the two electrodes, such that the overlapping area between the electrodes on the edge of the ferroelectric area is reduced or eliminated. For example, at least one of the edges of the ferroelectric layer is not covered by the corresponding electrode. The electric coupling between the electrodes may thus be reduced in the edge of the ferroelectric layer, thus reducing the leakage current caused by any defects and/or contamination. The dimension of the recess can be determined based on the dimensions of the defective region on the edges and can be adjusted through design and fabrication. The recess can be employed in capacitor structures in 2D ferroelectric memory devices and 3D ferroelectric memory devices.

Figure 1A:
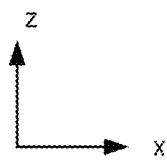

FIG. 1A illustrates a cross-section of an exemplary ferroelectric memory cell 100, according to some embodiments of the present disclosure. Ferroelectric memory cell 100 is the storage element of a 2D ferroelectric memory device and can include various designs and configurations. Areas circled in dashed lines may include defective edge regions, which contain defective and/or contaminated material caused by the fabrication process to form ferroelectric memory cell 100. As shown in FIG. 1, ferroelectric memory cell 100 is a "1T-1C" cell that includes a capacitor structure 102, a transistor 104, and an interconnect 106 between capacitor structure 102 and transistor 104 formed on a substrate 108. Substrate 108 can include silicon (e.g., single crystalline silicon), silicon germanium (SiGe), gallium arsenide (GaAs), germanium (Ge), silicon on insulator (SOI) or any other suitable materials.

Figure 2A:
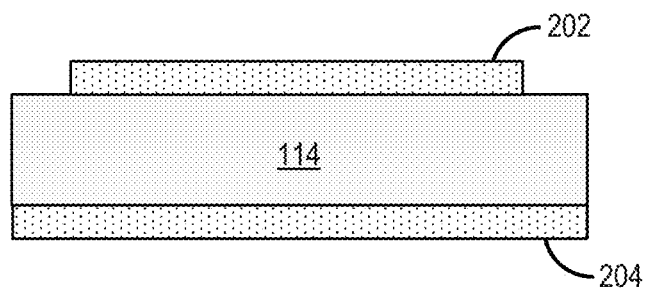
FIGS. 2A-2C each illustrates a cross-section of an exemplary ferroelectric capacitor structure, according to some embodiments of the present disclosure.
Figure 2B:
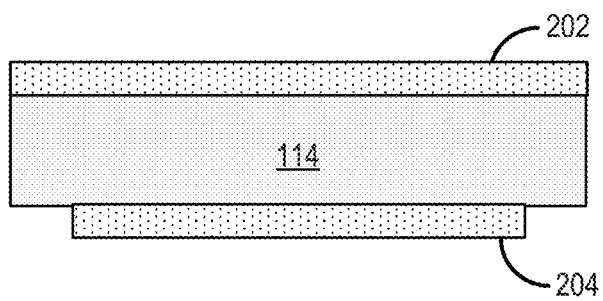
Figure 2C:
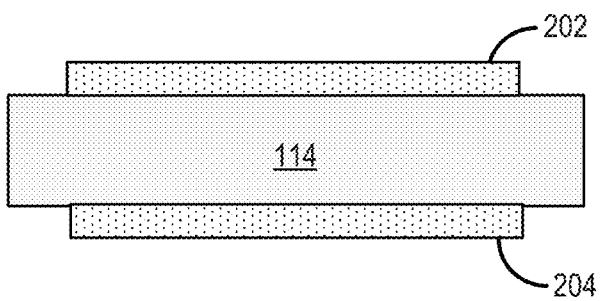
Figure 2C:
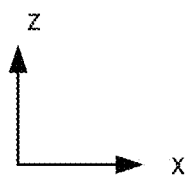

In some embodiments, capacitor structure 102 includes a lower electrode 110, an upper electrode 112, and a ferroelectric layer 114 disposed vertically between lower electrode 110 and upper electrode 112. Detailed structures of capacitor structure 102 are shown in FIGS. 2A-2C and are not included in FIG. 1A. Ferroelectric layer 114 may be in contact with and electrically connected to lower electrode 110 on a lower surface and in contact with and electrically connected to upper electrode 112 on an upper surface. Lower electrode 110 can be electrically connected to transistor 104 through interconnect 106, and upper electrode 112 can be electrically connected to a voltage source (not shown), such that an electrical field can be applied to ferroelectric layer 114. For ease of description, the example of a 1T-1C cell is illustrated in the present disclosure. In various embodiments, ferroelectric layer 114 can be used in any other suitable types of memory cells with more than one capacitor per cell. For example, ferroelectric layer 114 can also be used in a "2T-2C" cell or an "nT-mC" (where n and m are integers) cell. The type of memory cells (e.g., the number of capacitors in a single memory cell) should not be limited by the embodiments of the present disclosure.

The materials of lower electrode 110 and upper electrode 112 can include, but not limited to, at least one of titanium nitride (TiN), titanium silicon nitride (TiSiN$_x$), titanium aluminum nitride (TiAlN$_x$), titanium carbon nitride (TiCN$_x$), tantalum nitride (TaN$_x$), tantalum silicon nitride (TaSiN$_x$), tantalum aluminum nitride (TaAlN$_x$), tungsten nitride (WN$_x$), tungsten silicide (WSi$_x$), tungsten carbon nitride (WCN$_x$), ruthenium (Ru), ruthenium oxide (RuO$_x$), iridium (Ir), doped polysilicon, transparent conductive oxides (TCO), or iridium oxide (IrO$_x$). In some embodiments, lower electrode 110 and/or upper electrode include TiN and/or TaN$_x$. In some embodiments, lower electrode 110 and upper electrode 112 include the same material(s). In some other embodiments, lower electrode 110 and upper electrode 112 include different materials.

The thickness of lower electrode 110 or upper electrode 112 can be between about 2 nm and about 50 nm, such as between 2 nm and 20 nm (e.g., 2 nm, 3 nm, 4 nm, 5 nm, 8 nm, 10 nm, 15 nm, 18 nm, 20 nm, 25 nm, 30 nm, 35 nm, 40 nm, 45 nm, 50 nm, any range bounded on the lower end by any of these values, or in any range defined by any two of these values). In some embodiments, lower electrode 110 and upper electrode 112 have the same thickness. In some embodiments, lower electrode 110 and upper electrode 112 have different thicknesses.

In some embodiments, ferroelectric layer 114 includes a ferroelectric oxide material. The ferroelectric oxide may be doped with a plurality of dopants, which can improve ferroelectric film crystallization. For example, the dopants may provide elasticity during the crystallization of the doped ferroelectric layer, reducing the number of defects formed in the ferroelectric film crystallization, and improving high-K ferroelectric phase formation. It is understood that in some embodiments, ferroelectric layer 114 can include a multilayer structure.

The ferroelectric oxide material can include a ferroelectric composite oxide. In some embodiments, the ferroelectric oxide material includes oxygen and one or more ferroelectric metals. The ferroelectric metals can include, but not limited to, zirconium (Zr), hafnium (Hf), and titanium (Ti), aluminum (Al), In some embodiments, the ferroelectric oxide material includes oxygen and two or more ferroelectric metals. In some embodiments, the ferroelectric oxide material includes oxygen and a non-metal material such as silicon (Si).

Optionally, ferroelectric layer 114 may also include a plurality of dopants formed as a part of the crystal structures. In some embodiments, the dopants compensate for the defects formed during the crystallization of the ferroelectric oxide material to improve the film quality of ferroelectric layer 114. In some embodiments, the dopants are different from the ferroelectric metals in the ferroelectric oxide material and include one or more dopants from one or more of Hf, Zr, Ti, Al, Si, hydrogen (H), oxygen (O), vanadium (V), niobium (Nb), tantalum (Ta), yttrium (Y), and/or lanthanum (La).

In some embodiments, transistor 104 includes source/drain regions 120 and a gate stack having a gate dielectric 122 and a gate conductor 124. Source/drain regions 120 can be doped portions in substrate 108 with n-type or p-type dopants at a desired doping level. Gate dielectric 122 can include dielectric materials, such as silicon oxide (SiO$_x$), silicon nitride (SiN$_x$) or high-k dielectric materials including, but not limited to, aluminum oxide (Al$_2$O$_3$), hafnium oxide (HfO$_2$), tantalum oxide (Ta$_2$O$_5$), zirconium oxide (ZrO$_2$), titanium oxide (TiO$_2$), or any combination thereof. Gate conductor 124 can include conductive materials including, but not limited to, tungsten (W), cobalt (Co), copper (Cu), Al, polysilicon, silicides, or any combination thereof. Gate conductor 124 can function as the word line of ferroelectric memory cell 100. An interconnect (not shown) can be in contact with one of source/drain regions 120 that is not in contact with interconnect 106 and function as the bit line of ferroelectric memory cell 100.

Figure 1B:
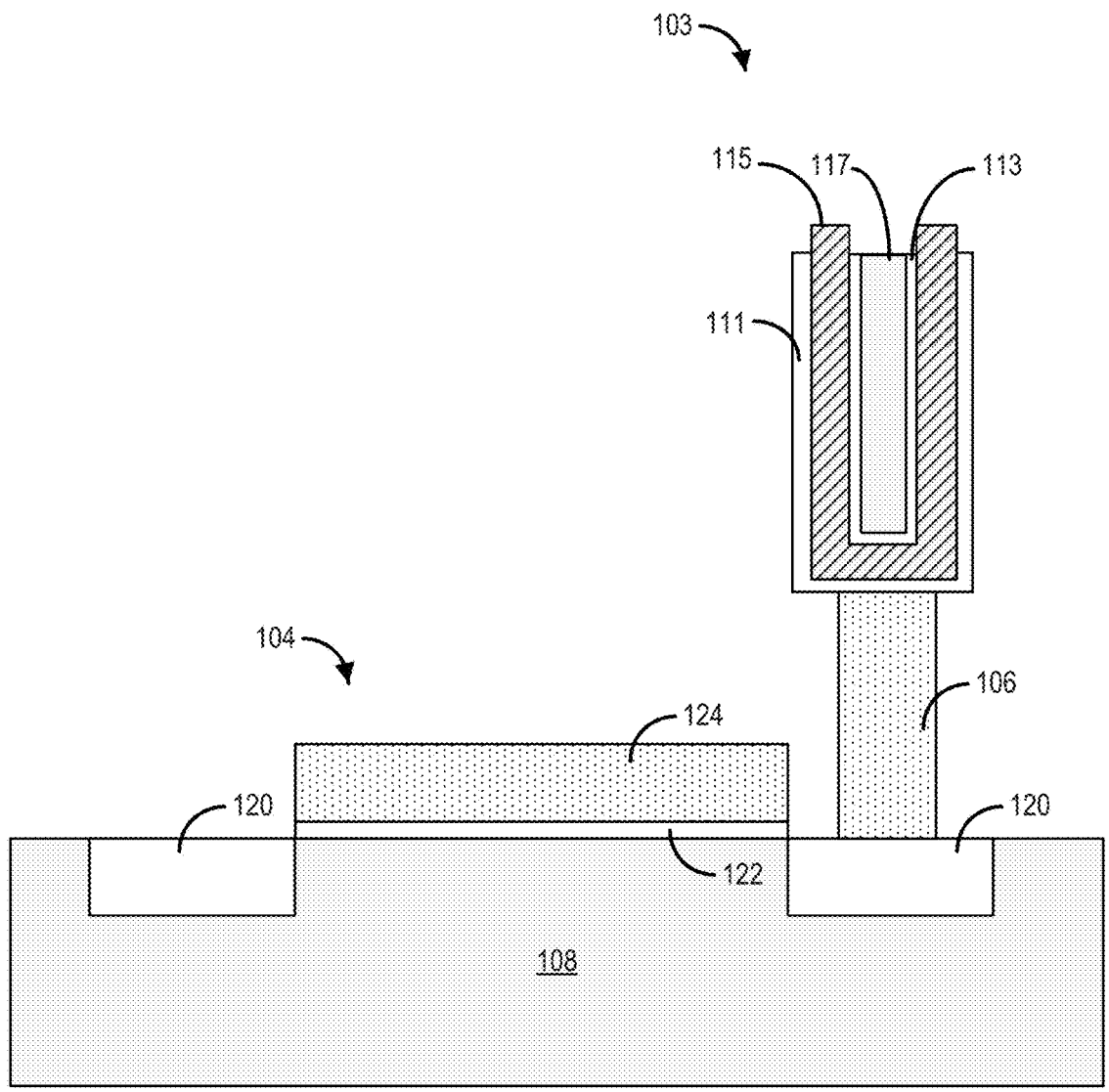
FIG. 1B illustrates a cross-section of another exemplary ferroelectric memory cell, according to some embodiments of the present disclosure.

FIG. 1B illustrates a cross-section of another exemplary ferroelectric memory cell 101, according to some embodiments of the present disclosure. Different from ferroelectric memory cell 100, ferroelectric memory cell 101 includes a capacitor structure 103 that is the storage element, e.g., a memory string, of a 3D ferroelectric memory device. For ease of illustration, components with the same labels are similar or the same with each other in FIGS. 1A and 1B, and the descriptions are not repeated for FIG. 1B.

Figure 3A:
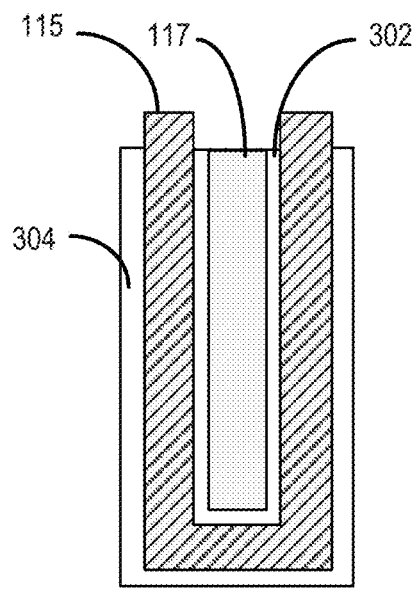
FIGS. 3A and 3B each illustrates a cross-section of an exemplary ferroelectric capacitor structure, according to some embodiments of the present disclosure.
Figure 3B:
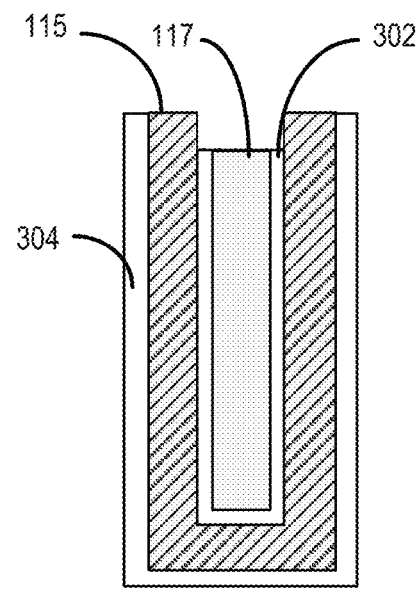

Capacitor structure 103 may include a conductor layer 117, a second electrode 113, a ferroelectric layer 115, and a first electrode 111 disposed radially from the center of capacitor structure 103 in this order. That is, ferroelectric layer 115 can be disposed radially between second electrode 113 and first electrode 111. Conductor layer 117 fills the remaining area inside second electrode 113 and includes a conductor material, such as a metal. The material of ferroelectric layer 115, second electrode 113, and first electrode 111 may be similar to ferroelectric layer 114, upper electrode 112, and lower electrode 110 described in FIG. 1A. In some embodiments, ferroelectric layer 115, second electrode 113, and first electrode 111 may each have a "U" shape. Detailed structures of capacitor structure 103 are shown in FIGS. 3A and 3B and are not included in FIG. 1B.

FIGS. 2A-2C each depicts the cross-sectional view of an exemplary capacitor structure 102, according to some embodiments. As shown in FIGS. 2A-2C, a recess is located between a side surface of at least one of an upper electrode 202 and a lower electrode 204, and a side surface of ferroelectric layer 114. In the present disclosure, a "side surface," in the description of a capacitor structure (e.g., storage element) in a 2D ferroelectric memory device, refers to a sidewall of the respective structure. The side surface may face a horizontal direction (e.g., the x-direction).

In some embodiments, as shown in FIG. 2A, a recess is located between the side surface of upper electrode 202 and a side surface of ferroelectric layer 114. In some embodiments, the lateral dimension (e.g., along the x-direction) of the recess is in a range of about 1 nm to about 50 nm, e.g., 1 nm, 5 nm, 15 nm, 20 nm, 25 nm, 30 nm, 35 nm, 40 nm, 45 nm, 50 nm. It should be noted that the lateral dimension of the recess can be flexibly determined, e.g., based on the lateral dimension of ferroelectric layer 114 and/or the lateral dimension of the defective region in the edge, and should not be limited by the embodiments of the present disclosure. The side surface of lower electrode 204 may be nominally coplanar with the side surface of ferroelectric layer 114. That is, side surfaces of upper electrode 202 and lower electrode 204 may have a staggered configuration along the vertical direction (e.g., the z-direction) such that an edge (or an upper surface of the edge) of ferroelectric layer 114 is not covered by upper electrode 202 (or both of upper and lower electrodes 202 and 204). The capacitance of capacitor structure 102 and the electrical coupling between upper and lower electrodes 202 and 204 may at least partially depend on the area covered by upper electrode 202. Even if the edge of ferroelectric layer 114 is defective/non-ideal, little or no leakage current can be formed between upper and lower electrodes 202 and 204 in the edge.

In some embodiments, as shown in FIG. 2B, a recess is located between a side surface of lower electrode 204 and a side surface of ferroelectric layer 114. The side surface of upper electrode 202 may be nominally coplanar with the side surface of ferroelectric layer 114. That is, side surfaces of upper electrode 202 and lower electrode 204 may have a staggered configuration along the vertical direction (e.g., the z-direction) such that an edge (or a lower surface of the edge) of ferroelectric layer 114 is not covered by lower electrode 204 (or both of upper and lower electrodes 202 and 204). The capacitance of capacitor structure 102 and the electrical coupling between upper and lower electrodes 202 and 204 may at least partially depend on the area covered by lower electrode 204. Even if the edge of ferroelectric layer 114 is defective/non-ideal, little or no leakage current can be formed between upper and lower electrodes 202 and 204 in the edge.

In some embodiments, as shown in FIG. 2C, a recess is located between the side surface of upper electrode 202 and the side surface of ferroelectric layer 114, and another recess is located between the side surface of lower electrode 204 and the side surface of ferroelectric layer 114. The side surfaces of upper and lower electrodes 202 and 204 may or may not be aligned with each other along the vertical direction (e.g., the z-direction). That is, the area in ferroelectric layer 114 covered by upper electrode 202 may be the same as or different from that by lower electrode 204. In some embodiments, an edge (or the upper and lower surfaces of the edge) of ferroelectric layer 114 is not covered by upper electrode 202 or lower electrodes 204. The capacitance of capacitor structure 102 and the electrical coupling between upper and lower electrodes 202 and 204 may at least partially depend on the overlapping area between upper electrode 202 and lower electrode 204 along the vertical direction (e.g., the z-direction). Thus, even if the edge of ferroelectric layer 114 is defective/non-ideal, little or no leakage current can be formed between upper and lower electrodes 202 and 204 in the edge.

FIGS. 3A and 3B each depicts the cross-sectional view of an exemplary capacitor structure 103, according to some embodiments. As shown in FIGS. 3A and 3B, capacitor structure 103 includes a recess between a top surface of at least one of a first electrode 304 and a second electrode 302 and a top surface of ferroelectric layer 115. In the present disclosure, a "side surface," in the description of a capacitor structure (e.g., storage element) in a 3D ferroelectric memory device, refers to a top or bottom surface of the respective structure. The side surface may face a vertical direction (e.g., the z-direction).

In some embodiments, as shown in FIG. 3A, a recess is located between the top surface of first electrode 304 and the top surface of ferroelectric layer 115, and another recess is located between the top surface of second electrode 302 and the top surface of ferroelectric layer 115. In some embodiments, the vertical dimension (e.g., along the x-direction) of each recess is in a range of about 1 nm to about 50 nm, e.g., 1 nm, 5 nm, 15 nm, 20 nm, 25 nm, 30 nm, 35 nm, 40 nm, 45 nm, 50 nm. In some embodiments, top surfaces of first and second electrodes 304 and 302 are nominally coplanar with each other. In some embodiments, a top surface of conductor layer 117 is nominally coplanar with the top surface of second electrode 302. That is, an edge (or a top portion) of ferroelectric layer 115 is not covered by first electrode 304 or second electrodes 302. The capacitance of capacitor structure 103 and the electrical coupling between first and second electrodes 304 and 302 may at least partially depend on the overlapping area between first electrode 304 and second electrode 302. Even if the edge/top portion of ferroelectric layer 115 is defective/non-ideal, little or no leakage current can be formed between first and second electrodes 304 and 302 in the edge/top portion.

In some embodiments, as shown in FIG. 3B, a recess is located between the top surface of second electrode 302 and the top surface of ferroelectric layer 115. The top surfaces of first electrode 304 and ferroelectric layer 115 are coplanar with each other. In some embodiments, the top surface of conductor layer 117 is nominally coplanar with the top surface of second electrode 302. That is, an edge (or a top portion) of ferroelectric layer 115 is not covered by second electrode 302 (or both of first and second electrodes 304 and 302). The capacitance of capacitor structure 103 and the electrical coupling between first and second electrodes 304 and 302 may at least partially depend on the area covered by second electrode 302. Even if the edge/top portion of ferroelectric layer 115 is defective/non-ideal, little or no leakage current can be formed between first and second electrodes 304 and 302 in the edge/top portion.

Figure 12:
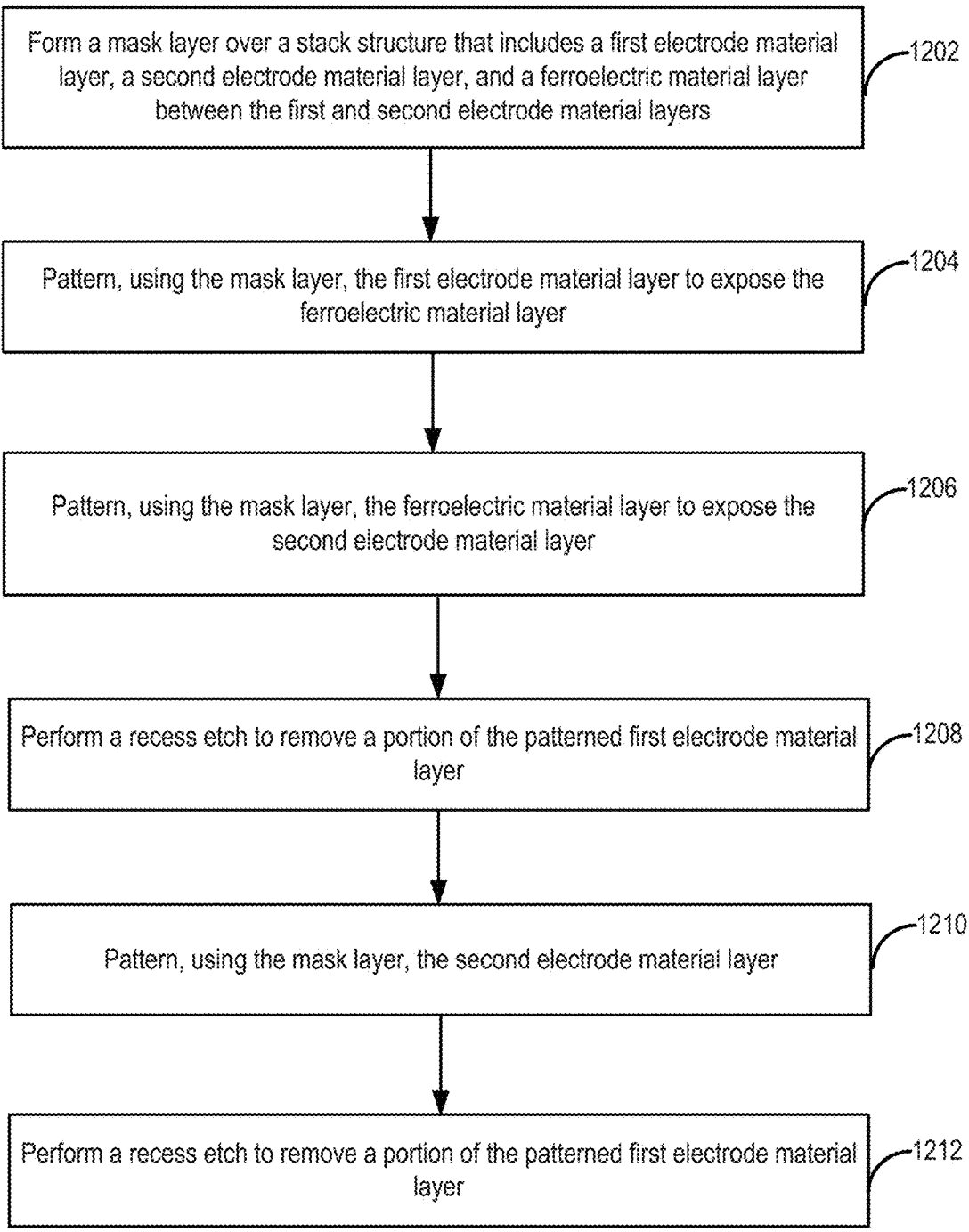
FIG. 12 is a flowchart of an exemplary method for forming a ferroelectric memory cell, according to some embodiments of the present disclosure.

FIGS. 4A-4D, 5A and 5B, 6A-6D, 7A-7C, and 8 illustrate methods 400, 500, 600, 700, and 800 for forming various configurations of capacitor structure 102 with reduced edge leakage, according to some embodiments. FIG. 12 illustrates a flowchart 1200 for methods 400, 500, 600, 700, and 800, according to some embodiments. For ease of illustration, FIGS. 4A-4D, 5A and 5B, 6A-6D, 7A-7C, 8, and 12 are described together. It should be understood that the operations shown in methods 400, 500, 600, 700, and 800 are not exhaustive and that other operations can be performed as well before, after, or between any of the illustrated operations. Further, some of the operations may be performed simultaneously, or in a different order than shown in the figures. In various embodiments, each of methods 400, 500, 600, 700, and 800 can include part or all of the operations in flowchart 1200. In some embodiments, some operations of a method are not shown in flowchart 1200.

In the formation of capacitor structures of the present disclosure, suitable etchants can be used, e.g., based on the materials of the capacitor structures, for the patterning and/or recess etch (e.g., pulled-back etch) processes. In various embodiments, the etchant can include a combination of different gases, and the ratio/concentration of each gas can be adjusted to optimize the patterning and/or recess etch effects. For example, the electrodes in the capacitor structures can include TiN and/or TaN, and the patterning and/or recess etch processes can include an etchant formed by boron trichloride ($BCl_3$), chlorine ($Cl_2$), fluorine ($F_2$), carbon tetrafluoride ($CF_4$), carbon fluoride ($CHF_x$), sulfur fluoride ($SF_x$), nitrogen fluoride ($NF_x$), nitrogen ($N_2$), and/or argon (Ar). In an example, the ratio/concentration of $Cl_2$ to $BCl_3$ can be adjusted to adjust the etch rates and/or etching selectivities. Other etch conditions/parameters, such as radio frequency (RF) power, gas flows, bias on the wafer, and pressure of the chamber, can also be adjusted accordingly for optimized patterning and/etching effects.

FIGS. 4A-4D illustrate an exemplary fabrication method 400 to form a capacitor structure that is part of a 2D ferroelectric memory cell with reduced edge leakage, according to some embodiments.

Figure 4A:
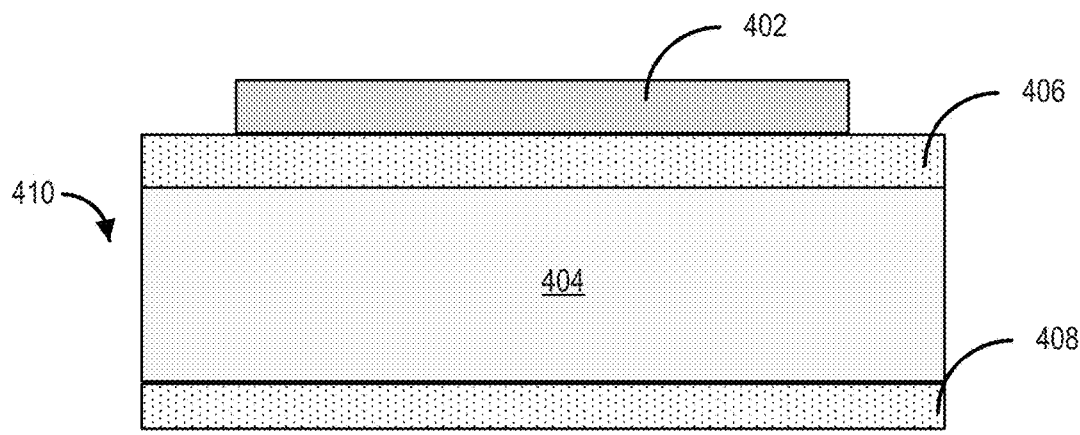
FIGS. 4A-4D illustrate an exemplary method for forming a ferroelectric capacitor structure, according to some embodiments of the present disclosure.

Referring to FIG. 12, method 400 starts at operation 1202, in which a mask layer is formed over a stack structure. The stack structure includes a first electrode material layer, a second electrode material layer, and a ferroelectric material layer between the first and second electrode material layers. FIG. 4A illustrates a corresponding structure.

As shown in FIG. 4A, a mask layer 402 may be formed over a stack structure 410, which may include a first electrode material layer 406, a second electrode material layer 408, and a ferroelectric material layer 404 between the first and second electrode material layers 406 and 408. Stack structure 410 may provide the base for forming a plurality of capacitor structures. Specifically, stack structure 410 may be patterned and divided into a plurality of portions, each being formed to a capacitor structure. In some embodiments, first electrode material layer 406 represents an upper electrode material layer, and second electrode material layer 408 represents a lower electrode material layer. Materials of first electrode material layer 406, ferroelectric material layer 404, and second electrode material layer 408 may respectively be similar to that of upper electrode 112, ferroelectric layer 114, and lower electrode 110, and the detailed descriptions are not repeated herein. In various embodiments, first and second electrode material layers 406 and 408 may each include TiN and/or $TaN_x$, and may include the same material or different materials.

Mask layer 402 may be subsequently employed as an etch mask for patterning first electrode material layer 406, ferroelectric material layer 404, and second electrode material layer 408. In some embodiments, mask layer 402 is also used in the recess etch of first electrode material layer 406 and/or second electrode material layer 408. In some embodiments, the dimensions (e.g., the area) of mask layer 402 may be employed to determine the dimensions/area of the ferroelectric layer and the electrodes, formed in subsequent operations. Mask layer 402 may include a soft mask and/or a hard mask. In some embodiments, mask layer 402 is a soft mask and includes a patterned photoresist layer.

Second electrode material layer 408 can include a conductive layer deposited using at least one of physical vapor deposition (PVD), chemical vapor deposition (CVD), electrochemical deposition, atomic layer deposition (ALD), and pulsed laser deposition (PLD). The thickness of the second electrode material layer 408 can be between, e.g., 2 nm and 50 nm. Fabrication processes to form the conductive layer can also include photolithography, CMP, wet/dry etch, or any combination thereof. Ferroelectric material layer 404 may be formed above and in contact with second electrode material layer 408. Ferroelectric material layer 404 can include a dielectric material (e.g., ferroelectric oxide material). The dielectric material can include, but not limited to, oxygen and one or more ferroelectric metals, such as Zr, Hf, Al, and Ti. The dielectric material can be formed with any suitable deposition process such as CVD, ALD, PVD, sol-gel process, metal-organic chemical vapor deposition (MOCVD), chemical solution deposition (CSD) process, or any combination thereof. First electrode material layer 406 may be formed above and in contact with ferroelectric material layer 404. First electrode material layer 406 can include a conductive layer deposited using at least one of PVD, CVD, electrochemical deposition, PLD, chemical vapor deposition, and ALD. The thickness of first electrode material layer 406 can be between, e.g., 2 nm and 50 nm.

Figure 4B:
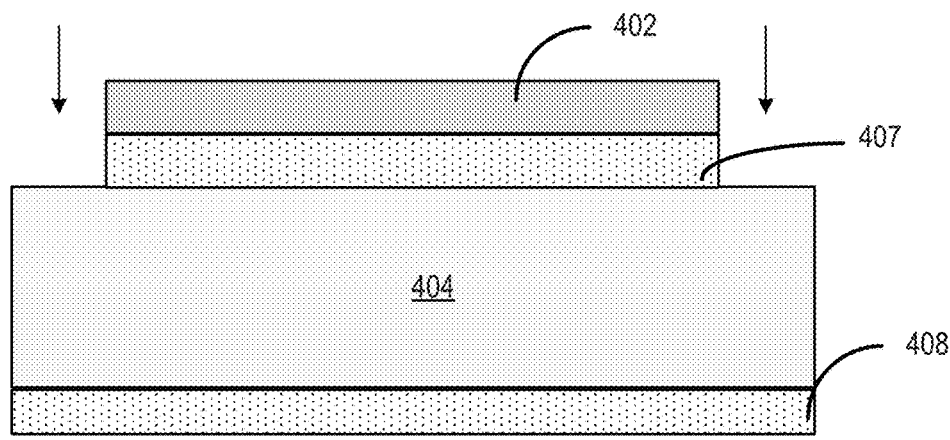
Figure 4B:
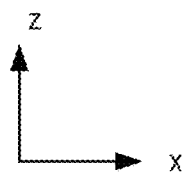

Referring back to FIG. 12, method 400 method proceeds to operation 1204, in which the first electrode material layer is patterned, using the mask layer, to expose the ferroelectric material layer. FIG. 4B illustrates a corresponding structure.

As shown in FIG. 4B, first electrode material layer 406 may be patterned using mask layer 402 to form a patterned first electrode material layer 407. A suitable dry etch and/or wet etch can be used to remove a portion of first electrode material layer 406 such that ferroelectric material layer 404 can be exposed. In some embodiments, an anisotropic etching process, e.g., dry etch, is performed to form patterned first electrode material layer 407.

Figure 4C:
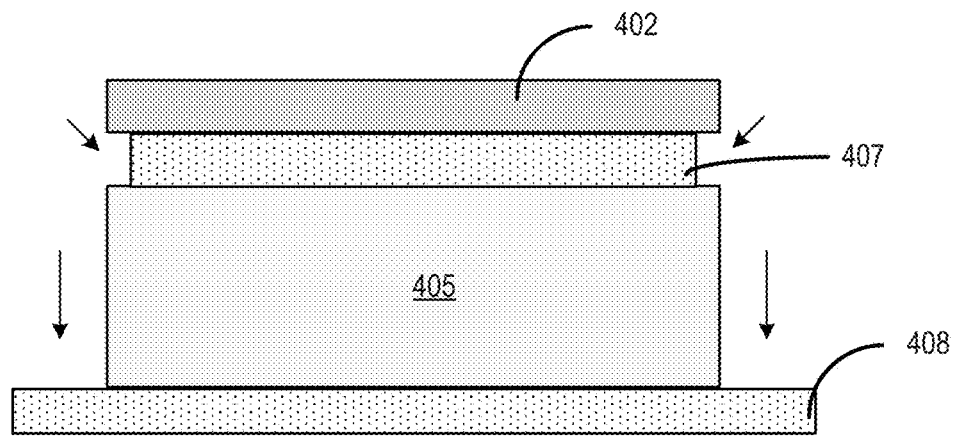

Referring back to FIG. 12, method 400 proceeds to operations 1206 and 1208, in which the ferroelectric material layer is patterned, using the mask layer, to expose the second electrode material layer, and a recess etch is performed to remove a portion of the patterned first electrode material layer. FIG. 4C illustrates a corresponding structure.

As shown in FIG. 4C, ferroelectric material layer 404 may be patterned using mask layer 402 to form a patterned ferroelectric material layer, which forms a ferroelectric layer 405. A suitable dry etch and/or wet etch can be used to remove a portion of ferroelectric material layer 404 such that second electrode material layer 408 can be exposed. In some embodiments, an anisotropic etching process, e.g., dry etch, is performed to form the patterned ferroelectric material layer.

The patterning of ferroelectric material layer 404 may or may not remove a portion of patterned first electrode material layer 407 at the same time. In some embodiments, the patterning of ferroelectric material layer 404 removes a portion of patterned first electrode material layer 407 that is exposed between mask layer 402 and ferroelectric layer 405 at the same time first electrode material layer 406 is being patterned. The etching of patterned first electrode material layer 407 is referred to as a recess etch of patterned first electrode material layer 407 (or a recess etch of first electrode material layer 406). In various embodiments, the etch rate of the recess etch on patterned first electrode material layer 407 can be higher than, nominally equal to, or lower than the etch rate on ferroelectric material layer 404, and can be adjusted by tuning the concentrations and/or ratios of gases in the etchant. By adjusting the concentrations and/or ratios of gases in the etchant, the etching selectivity of the etchant can be tuned to allow a desired portion of patterned first electrode material layer 407 to be removed in the recess etch. Also, the etch profile of the recess etch can be tuned between an isotropic etch profile and an anisotropic etch profile. For example, by increasing the concentration of Ar, RF power, and/or bias, the etch profile can be tuned to exhibit a more anisotropic etch profile such that the removed portion of patterned first electrode material layer 407 by the recess etch can be reduced.

Figure 4D:
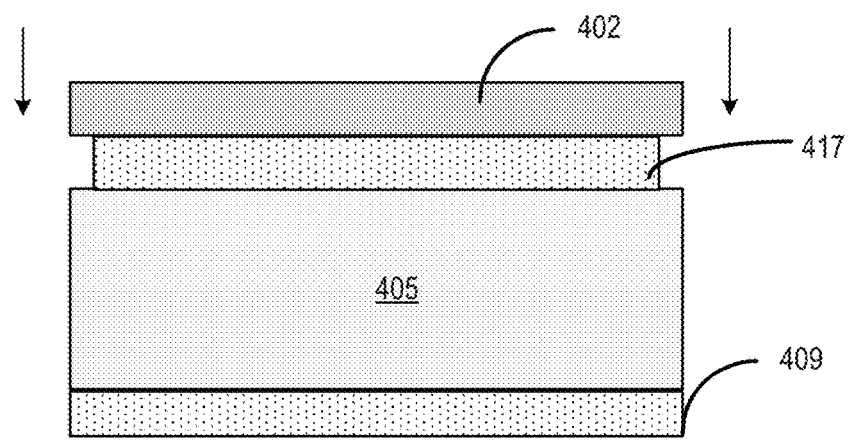
Figure 4D:
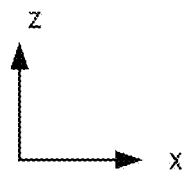

Referring back to FIG. 12, method 400 proceeds to operations 1210 and 1212, in which the second electrode material layer is patterned, using the mask layer, to form the second electrode, and a recess etch is performed to remove a portion of the patterned first electrode material layer. FIG. 4D illustrates a corresponding structure.

As shown in FIG. 4D, second electrode material layer 408 may be patterned using mask layer 402 to form a second electrode 409. A suitable dry etch and/or wet etch can be used to remove a portion of second electrode material layer 408, forming a second electrode 409. In some embodiments, an anisotropic etching process, e.g., dry etch, is performed to form second electrode 409.

The patterning of second electrode material layer 408 may or may not remove a portion of patterned first electrode material layer 407 at the same time. In some embodiments, the patterning of second electrode material layer 408 removes a portion of patterned first electrode material layer 407 that is exposed between mask layer 402 and ferroelectric layer 405 at the same time, and a first electrode 417 can be formed. The etching of patterned first electrode material layer 407 is referred to as another recess etch of patterned first electrode material layer 407 (or first electrode material layer 406). In various embodiments, the etch rate of the other recess etch on patterned first electrode material layer 407 can be higher than, nominally equal to, or lower than the etch rate on second electrode material layer 408, and can be adjusted by tuning the concentrations and/or ratios of gases in the etchant. For example, if first and second electrode material layers 406 and 408 include the same material(s), the etch rates may be nominally the same. Similar to the mechanism explained in the description of FIG. 4C, by adjusting the concentrations and/or ratios of gases in the etchant, the etching selectivity and the etch profile of the etchant can be tuned to allow a desired portion of patterned first electrode material layer 407 to be removed in the other recess etch.

Method 400 may result in a recess to be formed between the side surface of first electrode 417 and the side surface of ferroelectric layer 405. The side surfaces of ferroelectric layer 405 and second electrode 409 may be nominally coplanar. In various embodiments, the patterning of first electrode material layer 406 (operation 1204), ferroelectric material layer 404 (operation 1206), and second electrode material layer 408 (operation 1210) can each be performed separately, e.g., using a respective etchant and/or etch conditions. That is, the recess etch and the other recess etch of patterned first electrode material layer 407 can be performed separately, e.g., using a respective etchant and/or etch conditions. In some embodiments, the patterning of first electrode material layer 406, ferroelectric material layer 404, and second electrode material layer 408, and the recess etch and the other recess etch of patterned first electrode material layer 407 can be performed using the same etchant and/or etch condition, e.g., in a continuous operation.

Figure 5A:
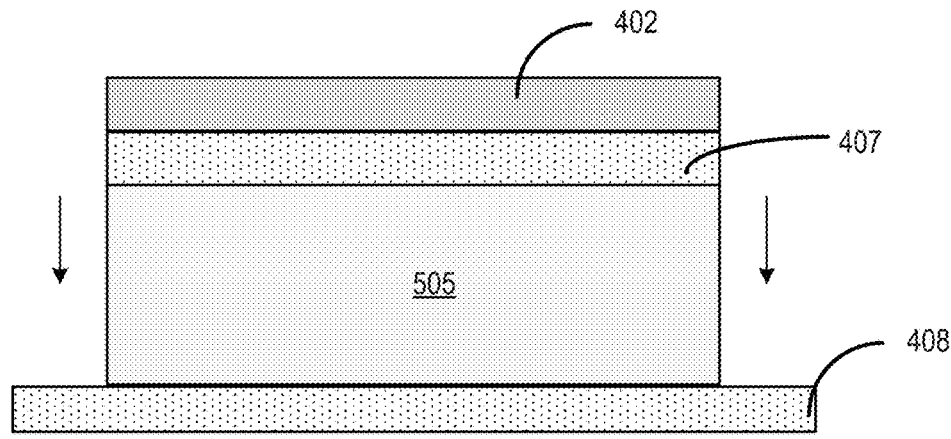
FIGS. 5A and 5B illustrate another exemplary method for forming a ferroelectric capacitor structure, according to some embodiments of the present disclosure.
Figure 5B:
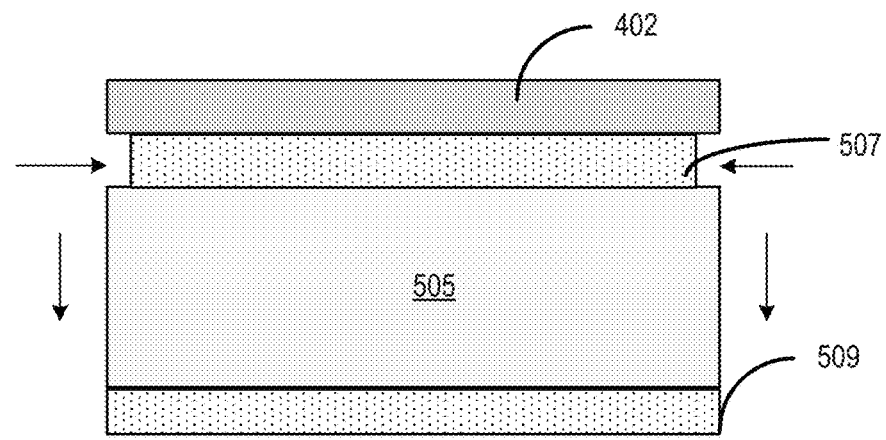
Figure 5B:
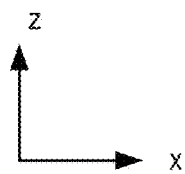

FIGS. 5A and 5B illustrate an exemplary fabrication method 500 to form a capacitor structure that is part of a 2D ferroelectric memory cell with reduced edge leakage, according to some embodiments. Different from method 400, in method 500, the patterned first electrode material layer may undergo little or no recess etch during the patterning of the ferroelectric material layer. The recess etch of the patterned first electrode material layer may be performed during and/or after the second electrode is formed.

Referring back to FIG. 12, after operation 1204, method 500 proceeds to operation 1206, in which the ferroelectric material layer is patterned using the mask layer to expose the second electrode material layer. FIG. 5A illustrates a corresponding structure.

As shown in FIG. 5A, ferroelectric material layer 404 may be patterned using mask layer 402 to form a ferroelectric layer 505. A suitable dry etch and/or wet etch can be used to remove a portion of ferroelectric material layer 404 such that second electrode material layer 408 can be exposed. In some embodiments, an anisotropic etching process, e.g., dry etch, is performed to form ferroelectric layer 505. Different from the operation illustrated in FIG. 4C, in some embodiments, the patterning of ferroelectric material layer 404 has a higher etch rate on ferroelectric material layer 404 than on patterned first electrode material layer 407, such that patterned first electrode material layer 407 undergoes little or no recess etch during the patterning of ferroelectric material layer 404. In other words, the etchant for patterning of ferroelectric material layer 404 may selectively etch ferroelectric material layer 404 to patterned first electrode material layer 407. In some embodiments, side surfaces of patterned first electrode material layer 407 and ferroelectric layer 505 are nominally planar. In some embodiments, the concentrations and/or ratios of gases in the etchant are adjusted to obtain the etching selectivity and the etch profile shown in FIG. 5A.

Referring back to FIG. 12, after operation 1206, method 500 proceeds to operation 1210 and 1212, in which the second electrode material layer is patterned using the mask layer, and a recess etch is performed to remove a portion of the patterned first electrode material layer. FIG. 5B illustrates a corresponding structure.

As shown in FIG. 5B, second electrode material layer 408 may be patterned using mask layer 402 to form a patterned second electrode material layer, which forms a second electrode 509. A recess may or may not be formed between side surfaces of second electrode 509 and ferroelectric layer 505. The patterning of second electrode material layer 408 can also remove a portion of patterned first electrode material layer 407 exposed between mask layer 402 and ferroelectric layer 505, forming a first electrode 507. That is, patterned first electrode material layer 407 may undergo a recess etch at the same time second electrode material layer 408 is being patterned such that a recess is formed between side surfaces of first electrode 507 and ferroelectric layer 505.

Suitable dry etches and/or wet etches can be used to, respectively, pattern ferroelectric material layer 404 and second electrode material layer 408. In some embodiments, an anisotropic etching process is performed for the patterning of ferroelectric material layer 404. The etchant may have a higher etch rate on ferroelectric material layer 404 than on patterned first electrode material layer 407 such that little or no recess is formed between side surfaces of patterned first electrode material layer 407 and ferroelectric layer 505. That is, side surfaces of patterned first electrode material layer 407 and ferroelectric layer 505 may be coplanar. In some embodiments, an isotropic etching process is performed for the patterning of second electrode material layer 408. The etchant may have a non-zero etch rate on each of second electrode material layer 408 and patterned first electrode material layer 407 such that when second electrode 509 is formed, a recess is formed between side surfaces of first electrode 507 and ferroelectric layer 505. The etchant may have a higher etch rate on second electrode material layer 408 than on ferroelectric material layer 404 such that side surfaces of second electrode 509 and ferroelectric layer 505 are nominally coplanar.

In some embodiments, the etchant and/or etch conditions used for patterning ferroelectric material layer 404 and second electrode material layer 408 are different. In some embodiments, the different etchants and/or etch conditions can be obtained by adjusting the concentrations and/or ratios of gases in the etchant and/or tuning etch conditions, thus changing the etching selectivity and the etch profile of the etchant. For example, to obtain the anisotropic etch for the patterning of ferroelectric material layer 404, the RF power and/or the bias in the reaction chamber can be increased, and concentrations and/or ratios of certain gases in the etchant can be adjusted to allow the etchant to selectively etch ferroelectric material layer 404 over patterned first electrode material layer 407. To obtain the isotropic etch for the patterning of second electrode material layer 408, the RF power and/or the bias in the reaction chamber can be decreased, and concentrations and/or ratios of certain gases in the etchant can be adjusted to allow the etchant to etch each of second electrode material layer 408 and patterned first electrode material layer 407 at the same time.

FIGS. 6A-6D illustrate an exemplary fabrication method 600 to form a capacitor structure that is part of a 2D ferroelectric memory cell with reduced edge leakage, according to some embodiments. Different from methods 400 and 500, in method 600, the electrode material layers may undergo little or no recess etch during the patterning of the stack structure. The recess etch of the first electrode material layer may be performed after the second electrode is formed.

Figure 6A:
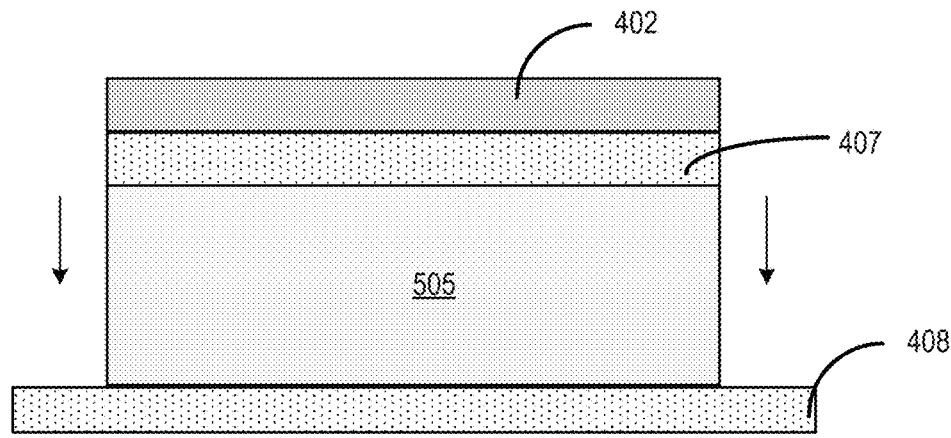
FIGS. 6A-6D illustrate another exemplary method for forming a ferroelectric capacitor structure, according to some embodiments of the present disclosure.

Referring back to FIG. 12, after operation 1204, method 600 proceeds to operation 1206, in which the ferroelectric material layer is patterned using the mask layer to expose the second electrode material layer. FIG. 6A illustrates a corresponding structure.

As shown in FIG. 6A, ferroelectric material layer 404 may be patterned using mask layer 402 to form a ferroelectric layer 505. The operation is the same as or similar to that described in FIG. 5A and the detailed description is not repeated herein.

Figure 6B:
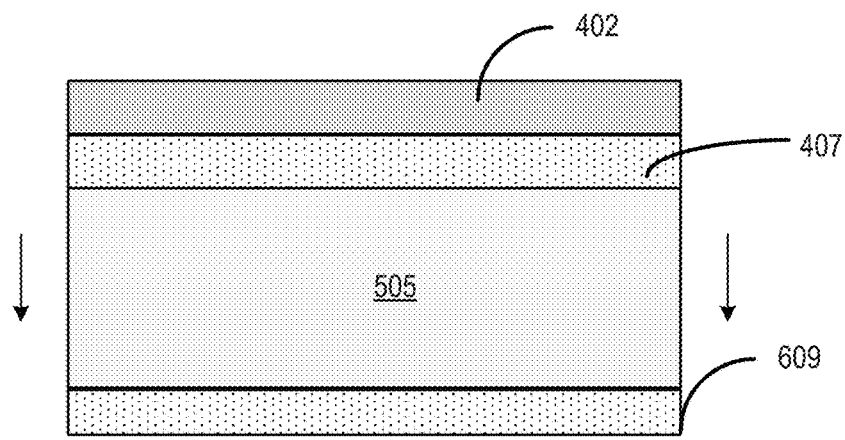

Referring back to FIG. 12, after operation 1206, method 600 proceeds to operation 1210, in which the second electrode material layer is patterned. FIG. 6B illustrates a corresponding structure.

As shown in FIG. 6B, second electrode material layer 408 may be patterned to form a patterned second electrode material layer, which forms a second electrode 609. The patterning of second electrode material layer 408 has a higher etch rate on second electrode material layer 408 than on patterned first electrode material layer 407 and ferroelectric layer 505, such that patterned first electrode material layer 407 undergoes little or no recess etch during the patterning of second electrode material layer 408. In other words, the etchant for patterning of second electrode material layer 408 may selectively etch second electrode material layer 408 over patterned first electrode material layer 407 and ferroelectric layer 505. In some embodiments, side surfaces of patterned first electrode material layer 407, second electrode 609, and ferroelectric layer 505 are nominally planar with one another.

A suitable dry etch and/or wet etch can be used to pattern second electrode material layer 408. In some embodiments, an anisotropic etching process is performed for the patterning of second electrode material layer 408. The etchant may have a higher etch rate on second electrode material layer 408 than on patterned first electrode material layer 407 and ferroelectric layer 505 such that little or no recess is formed between side surfaces of patterned first electrode material layer 407 and ferroelectric layer 505 and between side surfaces of second electrode 609 and ferroelectric layer 505. In some embodiments, the concentrations and/or ratios of gases in the etchant and/or tuning etch conditions for patterning of second electrode material layer 408 can be adjusted to obtain the desired etching selectivity and etch profile. For example, to obtain the isotropic etch for the patterning of second electrode material layer 408, the RF power and/or the bias in the reaction chamber can be increased, and concentrations and/or ratios of certain gases in the etchant can be adjusted to allow the etchant to selectively etch second electrode material layer 408 over patterned first electrode material layer 407 and ferroelectric layer 505.

Figure 6C:
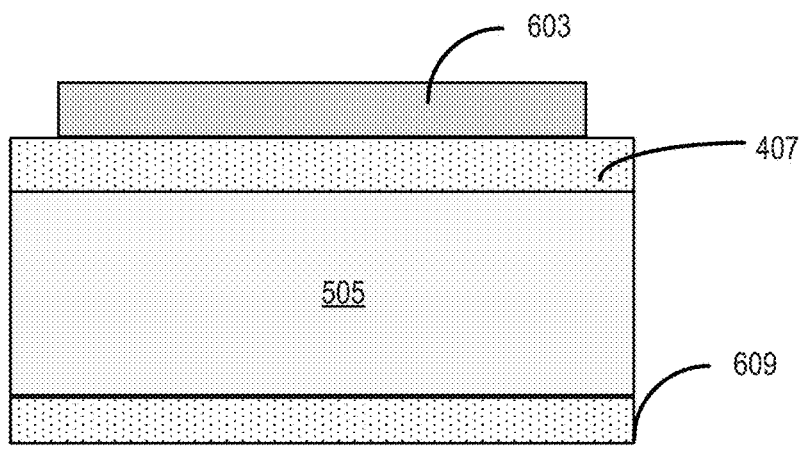
Figure 6D:
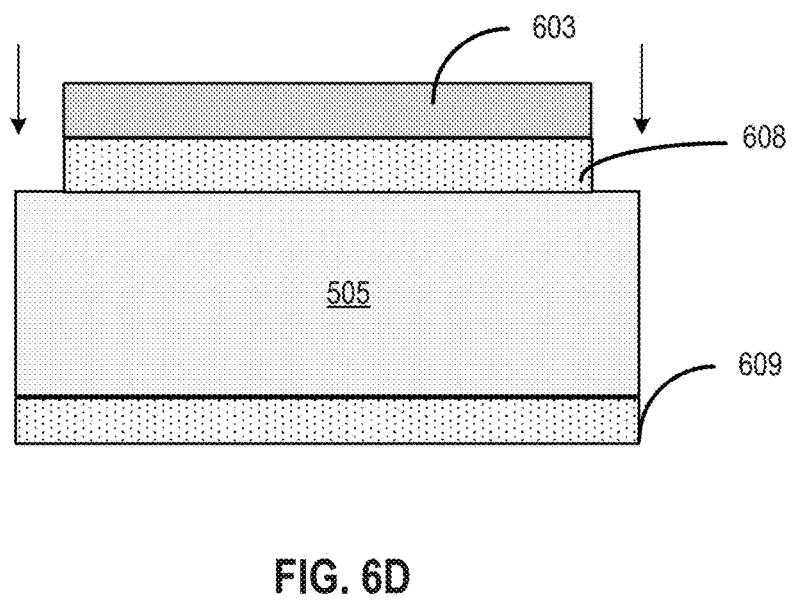

Referring back to FIG. 12, after operation 1210, method 600 proceeds to operation 1212, in which a recess etch is performed on the patterned first electrode material layer. FIGS. 6C and 6D illustrate corresponding structures.

As shown in FIG. 6C, mask layer 402 may be trimmed to form a mask layer 603 that exposes a portion of patterned first electrode material layer 407. A recess can be formed between side surfaces of mask layer 603 and patterned first electrode material layer 407. Any suitable methods can be performed to form mask layer 603. In some embodiments, a suitable dry etch and/or wet etch, e.g., an isotropic etching process, can be performed to trim mask layer 402. In some embodiments, mask layer 402 is removed, and mask layer 603 is formed by re-patterning a photoresist layer.

As shown in FIG. 6D, mask layer 603 may be used as the etch mask to perform the recess etch on patterned first electrode material layer 407 forming a first electrode 608. A recess is formed between side surfaces of first electrode 608 and ferroelectric layer 505. A suitable dry etch and/or wet etch, e.g., an anisotropic etching process, can be performed to etch patterned first electrode material layer 407. The etchant may have a higher etch rate on patterned first electrode material layer 407 than ferroelectric layer 505 such that the recess between side surfaces of mask layer 603 and ferroelectric layer 505 can be nominally transferred to first electrode 608.

Figure 7A:
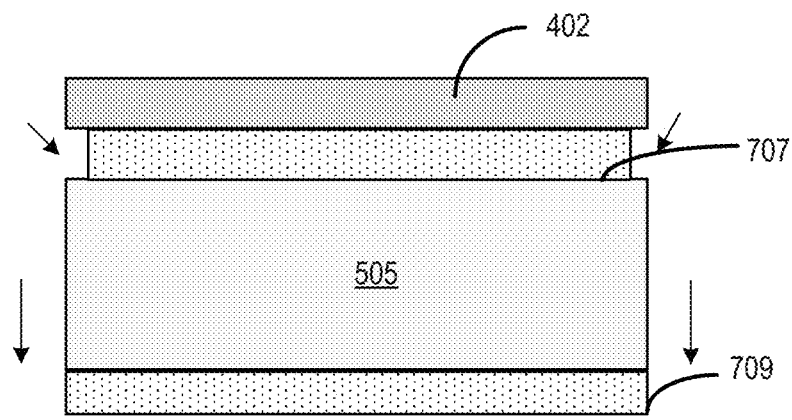
FIGS. 7A-7C illustrate another exemplary method for forming a ferroelectric capacitor structure, according to some embodiments of the present disclosure.
Figure 7B:
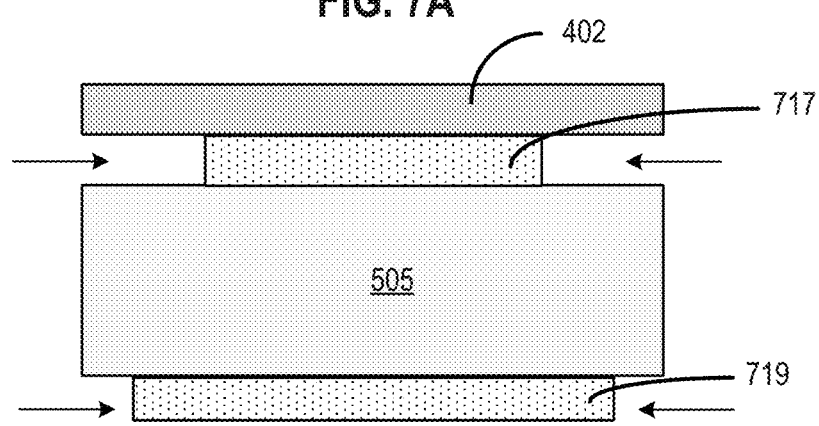
Figure 7C:
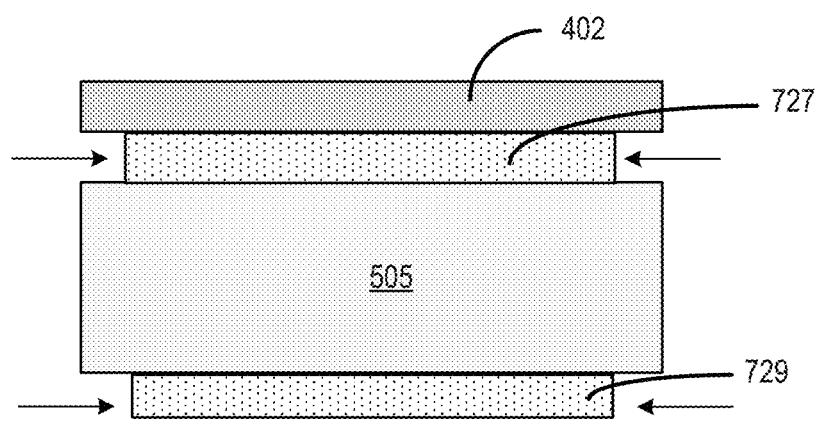

FIGS. 7A-7C illustrate an exemplary fabrication method 700 to form a capacitor structure that is part of a 2D ferroelectric memory cell with reduced edge leakage, according to some embodiments. Different from methods 400, 500, and 600, in method 700, each of the patterned first and second electrode material layers may undergo one or more recess etch, and the patterned first electrode material layer may undergo a recess etch at the same time the patterned second electrode material layer is being formed. Method 700 may be performed based on the structure shown in FIG. 6A.

Referring back to FIG. 12, after operation 1206, method 700 proceeds to operations 1210 and 1212, in which the second electrode material layer is patterned and a recess etch is performed to remove a portion of the patterned first electrode material layer. FIG. 7A illustrates a corresponding structure.

As shown in FIG. 7A, second electrode material layer 408 may be patterned to form a patterned second electrode material layer 709, and patterned first electrode material layer 407 may undergo a recess etch to form another patterned first electrode material layer 707. That is, the patterning of second electrode material layer 408 may also be used as the recess etch for patterned first electrode material layer 407 at the same time. A suitable dry etch and/or wet etch can be used. In some embodiments, an anisotropic etching process, e.g., dry etch, is performed to form second electrode 409. The patterning/etching process can be similar to that described for FIG. 4D and the detailed description is not repeated herein.

In some embodiments, after operation 1212, method 700 proceeds to an operation (not shown in FIG. 12) in which the patterned first and second electrode material layers each undergoes a recess etch to form the first and second electrodes. FIG. 7B illustrates a corresponding structure.

As shown in FIG. 7B, a recess etch can be performed on each of the other patterned first electrode material layer 707 and second electrode material layer 709 to form a first electrode 717 and a second electrode 719, respectively. A suitable isotropic etching process, dry etch and/or wet etch, can be performed for the recess etch. The recess etch may have a non-zero etch rate on each of the other patterned first electrode material layer 707 and second electrode material layer 709 such that a respective recess can be formed between sidewalls of first electrode 717 and ferroelectric layer 505 and between second electrode 719 and ferroelectric layer 505. In some embodiments, the etch rate on ferroelectric layer 505 is lower than those on the other patterned first electrode material layer 707 and second electrode material layer 709. To obtain the isotropic recess etch, the RF power and/or the bias in the reaction chamber can be decreased, and concentrations and/or ratios of certain gases in the etchant can be adjusted to allow the etchant to etch each of the other patterned first electrode material layer 707 and second electrode material layer 709 (e.g., over ferroelectric layer 505) at a desirable non-zero rate. In some embodiments, because the area of the other patterned first electrode material layer 707 is less than that of patterned second electrode material layer 709, the area of first electrode 717 is less than that of second electrode 719. In some embodiments, the recess between sidewalls of first electrode 717 and ferroelectric layer 505 is greater than that between second electrode 719 and ferroelectric layer 505.

In some embodiments, method 700 may also be performed based on the structure shown in FIG. 6B. For ease of illustration, second electrode 609 in FIG. 6B is described as patterned second electrode material layer 609 in this embodiment. Different from the fabrication operation described in FIGS. 7A and 7B, the patterned first and second electrode material layers each undergoes a recess etch to form the first and second electrodes after the patterned second electrode material layer is formed. FIG. 7C illustrates a corresponding structure.

As shown in FIG. 7C, a recess etch can be performed on each of patterned first and second electrode material layers 407 and 609 to form a first electrode 727 and a second electrode 729, respectively. A suitable isotropic etching process, dry etch and/or wet etch, can be performed for the recess etch. The recess etch may have a non-zero etch rate on each of patterned first and second electrode material layers 407 and 609 such that a respective recess can be formed between sidewalls of first electrode 727 and ferroelectric layer 505 and between second electrode 729 and ferroelectric layer 505. In some embodiments, the etch rate on ferroelectric layer 505 is lower than those on patterned first and second electrode material layers 407 and 609. To obtain the isotropic recess etch, the RF power and/or the bias in the reaction chamber can be decreased, and concentrations and/or ratios of certain gases in the etchant can be adjusted to allow the etchant to etch each of patterned first and second electrode material layers 407 and 609 (e.g., over ferroelectric layer 505) at a desirable non-zero rate. In some embodiments, the etch rate on first electrode 727 is nominally the same as that on second electrode 729. In some embodiments, the lateral dimension of the recess between sidewalls of first electrode 727 and ferroelectric layer 505 is nominally the same as that between second electrode 729 and ferroelectric layer 505.

Figure 8:
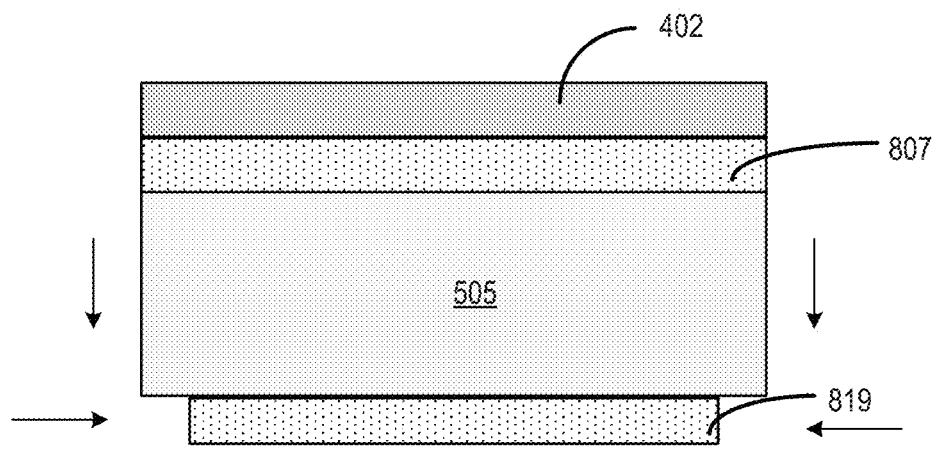
FIG. 8 illustrates another exemplary method for forming a ferroelectric capacitor structure, according to some embodiments of the present disclosure.
Figure 8:
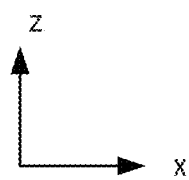

FIG. 8 illustrates an exemplary fabrication method 800 to form a capacitor that is part of a 2D ferroelectric memory cell with reduced edge leakage, according to some embodiments. Different from methods 400-700, in method 800, only the patterned second electrode material layer may undergo a recess etch. For ease of illustration, second electrode 609 in FIG. 6B is described as a patterned second electrode material layer in this embodiment. Method 800 may be performed based on the structure shown in FIG. 6B. FIG. 8 illustrates a corresponding structure.

As shown in FIG. 8, a recess etch can be performed on the patterned second electrode material layers to form a second electrode 819. Patterned first electrode material layer 407 may form a first electrode 807. A suitable isotropic etching process, dry etch and/or wet etch, can be performed for the recess etch. The recess etch may have a higher etch rate on the patterned second electrode material layers than first electrode 807 and ferroelectric layer 505. That is, the recess etch selectively etches the patterned second electrode material layer over first electrode 807 and ferroelectric layer 505. To obtain the isotropic recess etch, the RF power and/or the bias in the reaction chamber can be decreased, and concentrations and/or ratios of certain gases in the etchant can be adjusted to allow the etchant to selectively etch the patterned second electrode material layer (e.g., over first electrode 807 and ferroelectric layer 505) at a desirable non-zero rate. A recess can be formed between sidewalls of second electrode 819 and ferroelectric layer 505. In some embodiments, sidewalls of first electrode 807 and ferroelectric layer 505 are nominally coplanar.

Figure 9A:
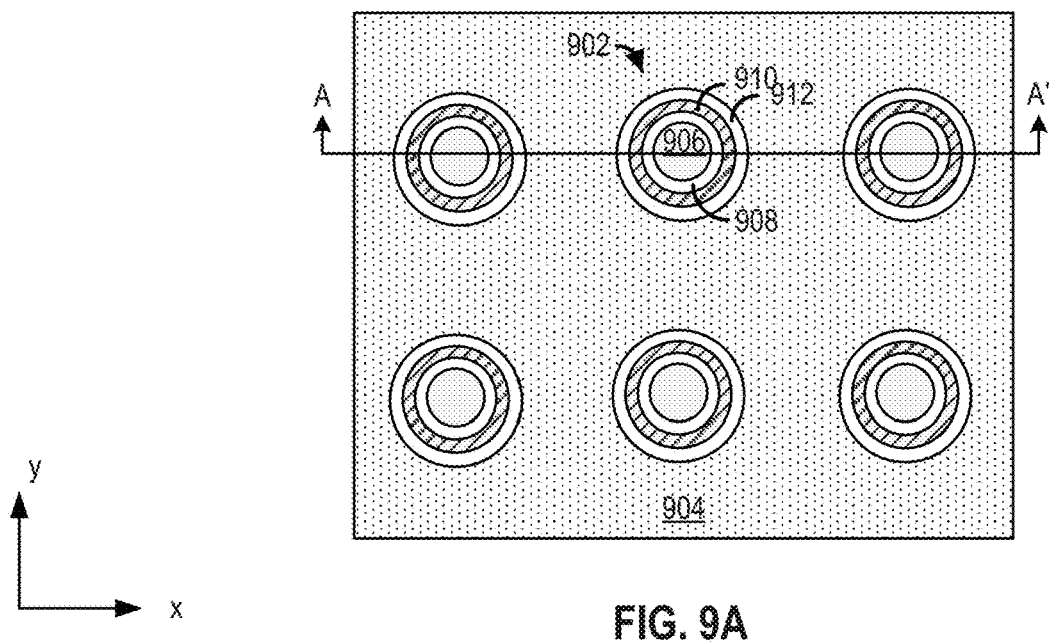
FIG. 9A illustrates a plan view of an exemplary ferroelectric memory device, according to some embodiments of the present disclosure.
Figure 9B:
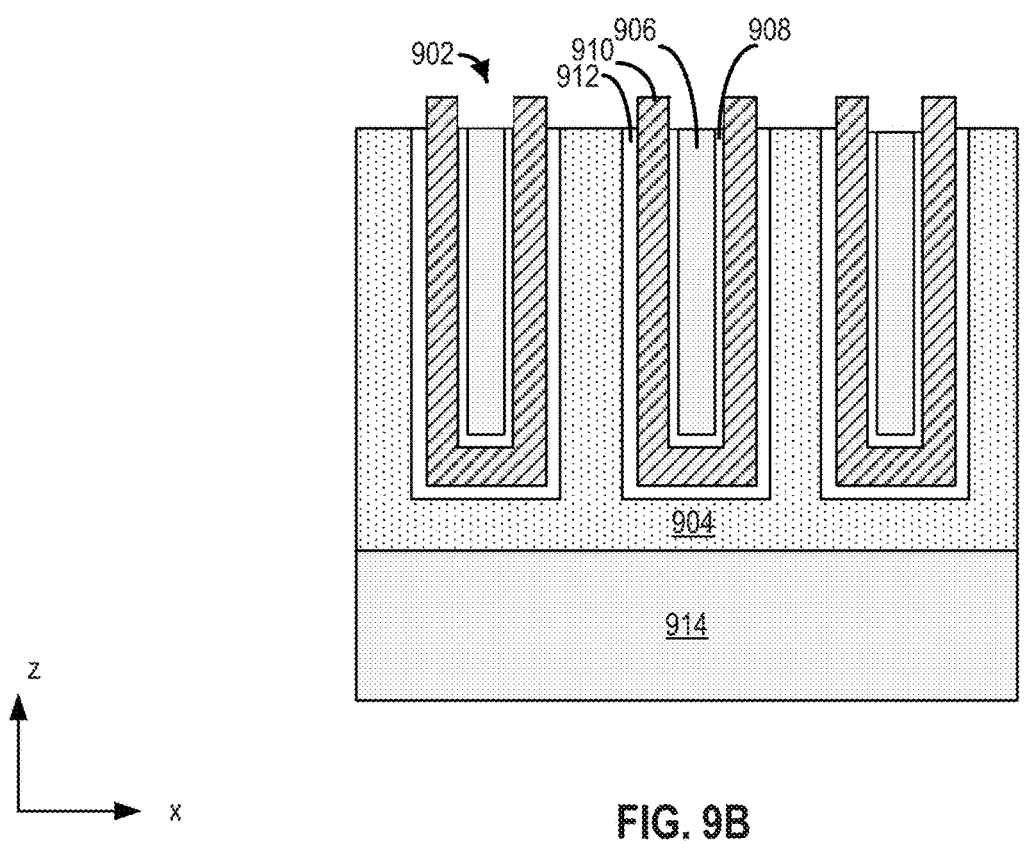
FIG. 9B illustrates a cross-section of an exemplary ferroelectric memory device, according to some embodiments of the present disclosure.

FIG. 9A illustrates a plan view of an exemplary ferroelectric memory device 900, according to some embodiments of the present disclosure. FIG. 9B illustrates a cross-section of ferroelectric memory device 900 along the A-A' direction, according to some embodiments. Ferroelectric memory device 900 is part of a 3D ferroelectric memory device, which may improve the ferroelectric properties and memory cell array density. The memory string of ferroelectric memory device 900 may be similar to or the same as capacitor structure 103 illustrated in FIG. 1B.

Ferroelectric memory device 900 can include an array of ferroelectric memory strings 902 disposed in one or more interlayered dielectric (ILD) layers 904 and extending vertically above a substrate (not shown). Each ferroelectric memory string 902 has a circular shape in the plan view and includes a conductor layer 906, a second electrode 908, a ferroelectric layer 910, and a first electrode 912 disposed radially from the center of ferroelectric memory string 902 in this order. That is, ferroelectric layer 910 can be disposed radially between second electrode 908 and first electrode 912. Conductor layer 906 fills the remaining area inside second electrode 908 and includes a conductor material, such as a metal. It is understood that the shape of ferroelectric memory string 902 in the plan view is not limited to circular and can be any other shapes, such as rectangular, square, oval, etc.

FIG. 9B illustrates a cross-section of ferroelectric memory device 900 along A-A' direction. As shown in FIG. 9B, ferroelectric memory device 900 includes a substrate 914 and the one or more ILD layers 904 disposed above substrate 914. Ferroelectric memory device 900 can also include a plurality of ferroelectric memory strings 902 extending vertically through ILD layers 904 and above substrate 914. In some embodiments, ferroelectric memory device 900 is electrically connected to one or more transistors via an interconnect (the transistors and the interconnects are not shown in FIG. 9B).

Figure 10A:
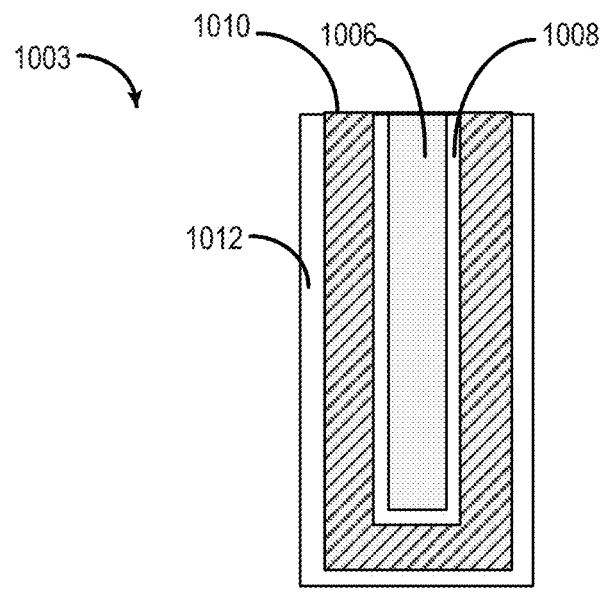
FIGS. 10A-10C illustrate another exemplary method for forming another ferroelectric capacitor structure, according to some embodiments of the present disclosure.
Figure 10B:
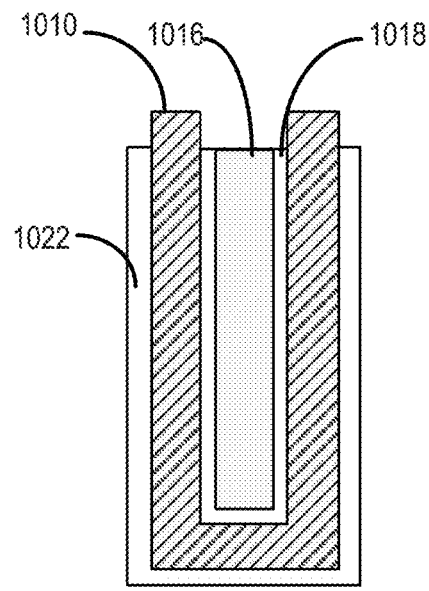
Figure 13:
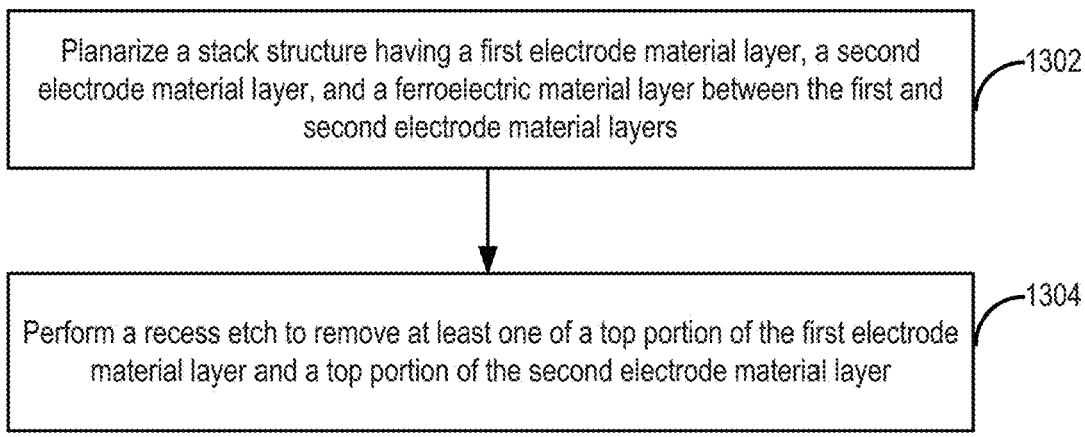
FIG. 13 is a flowchart of an exemplary method for forming another ferroelectric memory cell, according to some embodiments of the present disclosure.

Ferroelectric layer 910, second electrode 908, and first electrode 912 may be similar to ferroelectric layer 115, second electrode 113, and first electrode 111 described above in detail in FIG. 1B, and the detailed description is not repeated herein. Ferroelectric layer 910 can be disposed radially between second electrode 908 and first electrode 912. In some embodiments, ferroelectric layer 910, second electrode 908, and first electrode 912 may each have a "U" shape, and defective edge regions of ferroelectric layer 910, in the top portion of ferroelectric layer 910, may be exposed by second electrode 908 and first electrode 912 such that electrical couplings between first and second electrodes 912 and 908 are reduced in the top portion of ferroelectric layer 910. FIGS. 10A and 10B, and 11 illustrate methods 1000 and 1100 for forming various configurations of capacitor structure 103 with reduced edge leakage, according to some embodiments. FIG. 13 illustrates a flowchart 1300 for methods 1000 and 1100, according to some embodiments. For ease of illustration, FIGS. 10A-10C and 13 are described together. It should be understood that the operations shown in methods 1000 and 1100 are not exhaustive and that other operations can be performed as well before, after, or between any of the illustrated operations. Further, some of the operations may be performed simultaneously, or in a different order than shown in the figures.

FIGS. 10A and 10B illustrate an exemplary fabrication method 1000 to form a capacitor structure 103 (or ferroelectric memory string 902), according to some embodiments.

Referring to FIG. 13, method 1000 starts at operation 1302, in which a stack structure is planarized. The stack structure includes a first electrode material layer, a second electrode material layer, and a ferroelectric material layer between the first and second electrode material layers. FIG. 10A illustrates a corresponding structure.

As shown in FIG. 10A, a stack structure 1003, having a first electrode material layer 1012, a second electrode material layer 1008, and a ferroelectric material layer between the first and second electrode material layers 1012 and 1008, may be formed in an ILD layer. The ferroelectric material layer may form ferroelectric layer 1010. In some embodiments, a conductor material layer 1006 may partially or fully fill the space surrounded by second electrode material layer 1008. The materials of first and second electrode material layers 1012 and 1008, ferroelectric layer 1010, the ILD layer, and conductor material layer 1006 may respectively be similar to or the same as those in stack structure 1003, and the detailed descriptions are not repeated herein. In some embodiments, each stack structure 1003 has a circular shape in the plan view and includes a conductor material layer 1006, a second electrode material layer 1008, ferroelectric layer 1010, and a first electrode material layer 1012 disposed radially from the center of stack structure 1003 in this order. That is, ferroelectric layer 1010 can be disposed radially between second electrode material layer 1008 and first electrode material layer 1012.

First electrode material layer 1012 can include a conductive layer deposited using at least one of PVD, CVD, electrochemical deposition, ALD, and PLD. The thickness of the first electrode material layer 1012 can be between, e.g., 2 nm and 50 nm. Fabrication processes to form the conductive layer can also include photolithography, CMP, wet/dry etch, or any combination thereof. The ILD layer can include dielectric materials deposited by one or more thin film deposition processes including, but not limited to, CVD, PLD, ALD, sol-gel process, MOCVD, CSD, or any combination thereof. Ferroelectric layer 1010 may be formed above and in contact with first electrode material layer 1012. Ferroelectric layer 1010 can include a dielectric material (e.g., ferroelectric oxide material). The dielectric material can include, but not limited to, oxygen and one or more ferroelectric metals, such as Zr, Hf, Al, and Ti. The dielectric material can be formed with any suitable deposition process such as CVD, ALD, PVD, sol-gel process, MOCVD, CSD process, or any combination thereof. Second electrode material layer 1008 may be formed above and in contact with ferroelectric layer 1010. Second electrode material layer 1008 can include a conductive layer deposited using at least one of PVD, CVD, electrochemical deposition, PLD, and ALD. The thickness of second electrode material layer can be between, e.g., 2 nm and 50 nm.

A top surface of stack structure 1003 may be planarized. A suitable planarization method, such as chemical mechanical polishing (CMP) and/or an etching process, can be performed on stack structure 1003. In some embodiments, the etching process includes an anisotropic etching process such as dry etch. Top surfaces of first electrode material layer 1012, second electrode material layer 1008, ferroelectric layer 1010, and conductor material layer 1006 may be coplanar with one another.

Figure 10C:
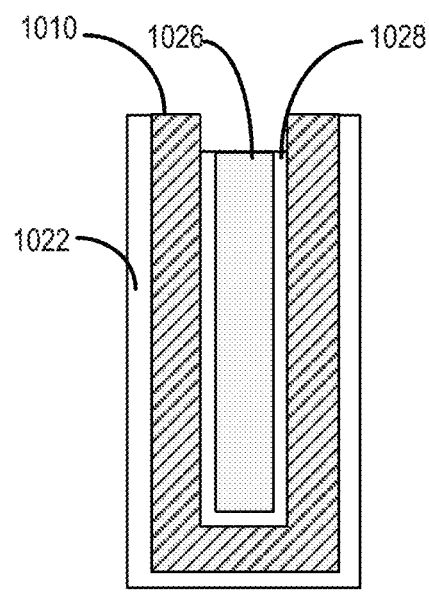

Referring to FIG. 13, method 1000 proceeds to operation 1304, in which a recess etch is performed to remove at least one of a top portion of the first electrode material layer and a top portion of the second electrode material layer. FIGS. 10B and 10C each illustrates a corresponding structure.

As shown in FIG. 10B, a top portion of first electrode material layer 1012 and a top portion of second electrode material layer 1008 are removed in a recess etch. In some embodiments, a top portion of conductor material layer 1006 is also removed by the same recess etch. Accordingly, a first electrode 1022, a second electrode 1018, and a conductor layer 1016, can be formed. In some embodiments, top surfaces of first electrode 1022, second electrode 1018, and conductor layer 1016 can be coplanar with one another, and can each be lower than the top surface of ferroelectric layer 1010. The recess etch may include any suitable etching process such as dry etch and/or wet etch. In some embodiments, first electrode 1022 and second electrode 1018 may include the same material or different materials.

Different from the structure shown in FIG. 10B, in FIG. 10C, a top portion of second electrode material layer 1008 is removed from a recess etch, and a second electrode 1028 may be formed. A top portion of first electrode material layer 1012 may be retained, and a first electrode 1022 may be formed. In some embodiments, a top portion of conductor material layer 1006 is also removed by the same recess etch that etches second electrode material layer 1008, forming a conductor layer 1026. In some embodiments, top surfaces of second electrode 1028 and conductor layer 1026 can be coplanar with one another, and can be lower than the top surface of ferroelectric layer 1010. The recess etch may include any suitable etching process such as dry etch and/or wet etch. The etchant may have a higher etch rate on second electrode material layer 1008 than on first electrode material layer 1012. That is, the etchant may selectively etch second electrode material layer 1008 over first electrode material layer 1012. In some embodiments, first electrode 1022 and second electrode 1018 include different materials.

Figure 11A:
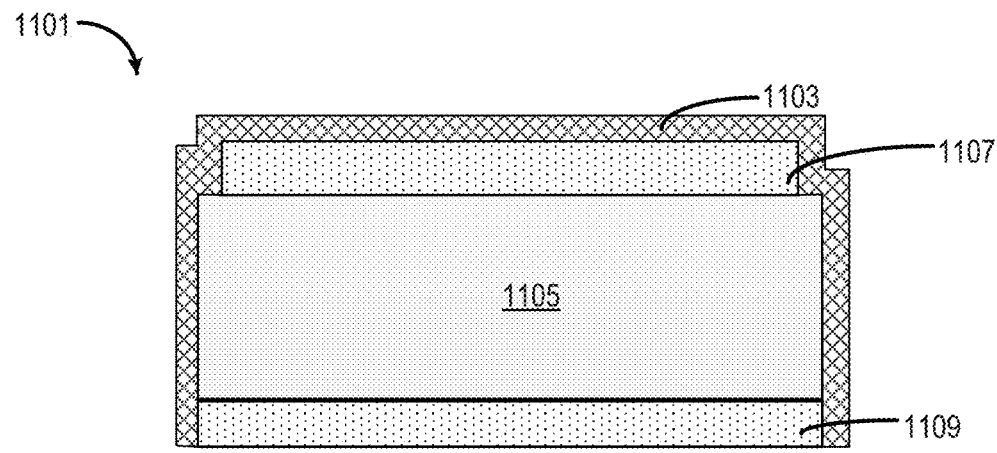
FIG. 11A illustrates a cross-section of an exemplary ferroelectric capacitor structure having a passivation layer, according to some embodiments of the present disclosure.
Figure 11B:
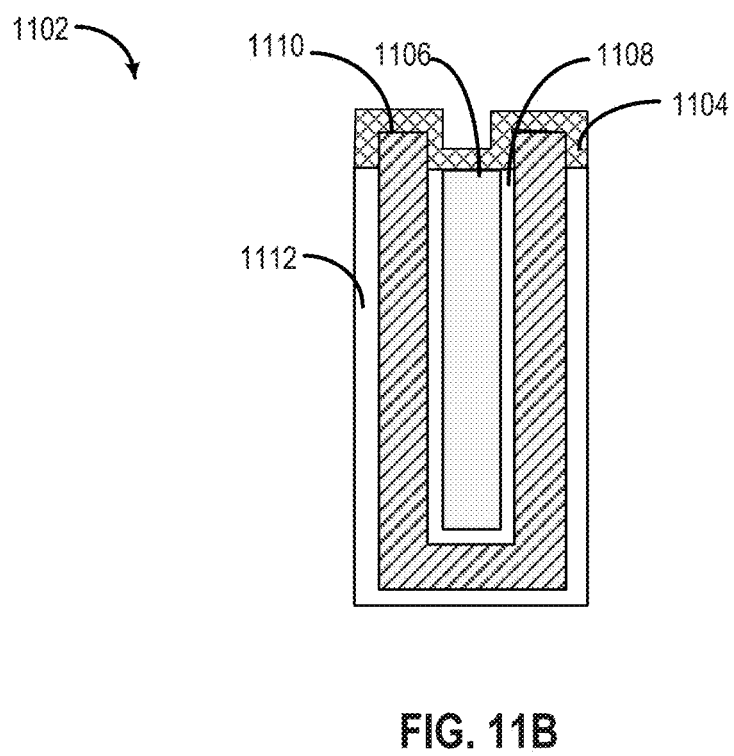
FIG. 11B illustrates a cross-section of another exemplary ferroelectric capacitor structure having a passivation layer, according to some embodiments of the present disclosure.

FIGS. 11A and 11B each illustrates a capacitor structure having a passivation layer to further reduce edge leakage, according to some embodiments. The passivation layer may form bonding with the ferroelectric layer, e.g., the dangling bonds and/or damaged bonds on the edges of the ferroelectric layer, thus passivating these areas. The passivation may result in a more stabilized ferroelectric memory cell (or ferroelectric layer). The passivation layer may cover at least a portion of the exposed edge of the ferroelectric layer. As examples, the passivation layers shown in FIGS. 11A and 11B each cover the entire exposed edges of each ferroelectric layer. It should be noted that the structures shown in FIGS. 11A and 11B are merely for illustration purposes and should not limit the structures on which passivation layers can be formed. Any capacitor structures in the present disclosure, with an exposed edge (e.g., formed by a recess on any of the electrodes and a sidewall/top surface), can be passivated using the passivation layer.

As shown in FIG. 11A, a capacitor structure 1101 may include an upper electrode 1107, a lower electrode 1109, and a ferroelectric layer 1105. Capacitor structure 1101 may include a recess between side surfaces of upper electrode 1107 and ferroelectric layer 1105. Capacitor structure 1101 may be a part of a 2D ferroelectric memory device. A passivation layer 1103 can be deposited to partially or fully cover the exposed edges of capacitor structure 1101. For example, the exposed edges may include, of ferroelectric layer 1105, the side surface and a portion of the top surface exposed by the recess.

As shown in FIG. 11B, a capacitor structure 1102 may include a first electrode 1112, a second electrode 1108, a ferroelectric layer 1110, and a conductor layer 1106. Capacitor structure 1102 may include a recess between top surfaces of first electrode 1112 and ferroelectric layer 1110 and another recess between top surfaces of second electrode 1108 and ferroelectric layer 1110. Capacitor structure 1102 may be a part of a 3D ferroelectric memory device. A passivation layer 1104 can be deposited to partially or fully cover the exposed edges (e.g., exposed top portions) of capacitor structure 1102. For example, the exposed edges may include, of ferroelectric layer 1110, the top surface and portions of the top portions exposed by the recesses.

Passivation layers 1103 and 1104 can each include any suitable dielectric materials, such as one or more of silicon oxide, silicon nitride, aluminum oxide, $HfO_x$, $ZrO_x$, $AlO_x$, hafnium zirconium oxide ($HfZrO_x$), hafnium silicon oxide ($HfSiO_x$), titanium silicon oxide ($TiSiO_x$), and titanium aluminum oxide ($TiAlO_x$). Passivation layers 1103 and 1104 may each be a single-layered structure or a multiple-layered structure. In some embodiments, passivation layers 1103 and 1104 may each have a thickness ranging from about 5 Å to about 500 Å. In some embodiments, the thickness of passivation layers 1103 and 1104 is each about 50 Å to about 200 Å. Passivation layers 1103 and 1104 can each be formed by one or more of PVD, CVD, and ALD.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a ferroelectric memory cell, comprising:
    forming a stack structure comprising a first electrode material layer, a second electrode material layer, and a ferroelectric material layer between the first electrode material layer and the second electric material layer;
    performing an etching process on the stack structure to form a capacitor structure comprising a patterned first electrode material layer, a patterned second electrode material layer, and a ferroelectric layer between the patterned first electrode material layer and the patterned second electrode material layer; and
    performing a recess etch, after the etching process, on at least one of the patterned first electrode material layer and the patterned second electrode layer to form the first electrode and the second electrode, wherein a recess is between a side surface of at least one of the first electrode or the second electrode and a side surface of the ferroelectric layer.

2. The method of claim 1, wherein:
the first and second electrode material layers each comprises at least one of titanium nitride (TiN) or tantalum nitride (TaN); and
performing the etching process on the stack structure comprises etching the stack structure using an etchant gas comprising at least one of boron trichloride ($BCl_3$), chlorine ($Cl_2$), fluorine ($F_2$), carbon tetrafluoride ($CF_4$), carbon fluoride ($CHF_x$), sulfur fluoride ($SF_x$), nitrogen fluoride ($NF_x$), nitrogen ($N_2$), or argon (Ar).

3. The method of claim 1, further comprising, for the etching process, using a mask layer over the stack stricture as an etch mask to:
pattern the first electrode material layer, the ferroelectric material layer, and the second electrode material layer to form, respectively, the patterned first electrode material layer, the ferroelectric layer, and the patterned second electrode material layer; and
perform a recess etch on the patterned first electrode material layer to form the first electrode and a respective recess between the side surface of the first electrode and the ferroelectric layer.

4. The method of claim 3, wherein performing the recess etch comprises performing the recess etch on the patterned first electrode material layer, comprising at least one of:
performing a first recess etch during the patterning of the ferroelectric material layer; or
performing a second recess etch during the patterning of the second electrode material layer.

5. The method of claim 3, wherein performing the recess etch comprises performing the recess etch on the patterned first electrode material layer, comprising:
after a formation of the patterned first electrode material layer, the ferroelectric layer, and the second electrode, trimming the mask layer such that a respective recess is formed between a side surface of the mask layer and the side surface of the patterned first electrode material layer; and
etching, using the trimmed mask layer as an etch mask, the patterned first electrode material layer to remove a portion of the patterned first electrode material layer exposed by the trimmed mask layer.

6. The method of claim 3, wherein performing the recess etch comprises performing the recess etch on each of the patterned first and second electrode material layers at the same time to respectively form the first and second electrodes, wherein a respective recess is between a side surface of each of the first and second electrodes and the side surface of the ferroelectric layer.

7. The method of claim 1, wherein the side surface of each of the first electrode and the second electrode comprises a respective top surface of the first electrode and the second electrode, and a side surface of the ferroelectric layer comprises a top surface of the ferroelectric layer, the second electrode, the ferroelectric layer, and the first electrode being disposed radially and outwardly; and wherein patterning the recess etch comprises:
planarizing top surfaces of the first electrode material layer, the second electrode material layer, and the ferroelectric material layer, and
etching a top portion of at least one of the first and second electrode material layers, the etching having a slower etch rate on the ferroelectric material layer than on the first and second electrode material layers.

8. A method for forming a ferroelectric memory cell, comprising:
forming a stack structure comprising a first electrode material layer, a second electrode material layer, and a ferroelectric material layer between the first electrode material layer and the second electric material layer;
patterning the stack structure, using a mask layer, to form a capacitor structure comprising a patterned first electrode material layer, a patterned second electrode material layer, and a ferroelectric layer between the patterned first electrode material layer and the patterned second electrode material layer; and
performing a recess etch, using the mask layer, on at least one of the patterned first electrode material layer and the patterned second electrode layer to form the first electrode and the second electrode, wherein a dimension of at least one of the first electrode or the second electrode is less than a dimension of the mask layer along an extending direction of the mask layer.

9. The method of claim 8, wherein performing the recess etch comprises performing the recess etch, using the mask layer, on the patterned first electrode material layer, comprising at least one of:
performing a first recess etch during the patterning of the ferroelectric material layer; or
performing a second recess etch during the patterning of the second electrode material layer.

10. The method of claim 8, wherein performing the recess etch, using the mask layer, comprises performing the recess etch on the patterned first electrode material layer, comprising:
performing the recess etch during the patterning of the second electrode material layer.

11. The method of claim 8, wherein performing the recess etch, using the mask layer, comprises performing the recess etch on the patterned first electrode material layer, comprising:
after a formation of the patterned first electrode material layer, the ferroelectric layer, and the second electrode, trimming the mask layer such that a respective recess is formed between a side surface of the mask layer and the side surface of the patterned first electrode material layer; and
etching, using the trimmed mask layer as an etch mask, the patterned first electrode material layer to remove a portion of the patterned first electrode material layer exposed by the trimmed mask layer.

12. The method of claim 8, wherein performing the recess etch, using the mask layer, comprises performing the recess etch on each of the patterned first and second electrode material layers at the same time to respectively form the first and second electrodes, wherein a respective recess is between a side surface of each of the first and second electrodes and the side surface of the ferroelectric layer.

13. The method of claim 8, wherein the side surface of each of the first electrode and the second electrode comprises a respective top surface of the first electrode and the second electrode, and a side surface of the ferroelectric layer comprises a top surface of the ferroelectric layer, the second electrode, the ferroelectric layer, and the first electrode being disposed radially and outwardly; and wherein patterning the recess etch comprises:
planarizing top surfaces of the first electrode material layer, the second electrode material layer, and the ferroelectric material layer, and
retching a top portion of at least one of the first and second electrode material layers, the etching having a slower etch rate on the ferroelectric material layer than on the first and second electrode material layers.

14. A method for forming a ferroelectric memory cell, comprising:
    forming a stack structure comprising a first electrode material layer, a second electrode material layer, and a ferroelectric material layer between the first electrode material layer and the second electric material layer;
    patterning the stack structure to form a capacitor structure comprising a patterned first electrode material layer, a patterned second electrode material layer, and a ferroelectric layer between the patterned first electrode material layer and the patterned second electrode material layer; and
    performing a recess etch on each of the patterned first electrode material layer and the patterned second electrode layer to form the first electrode and the second electrode, wherein a recess is between a side surface of at least one of the first electrode or the second electrode and a side surface of the ferroelectric layer.

15. The method of claim 14, wherein patterning the stack structure comprises, using a mask layer over the stack structure as an etch mask:
    patterning the first electrode material layer, the ferroelectric material layer, and the second electrode material layer to form, respectively, the patterned first electrode material layer, the ferroelectric layer, and the patterned second electrode material layer; and
    performing a recess etch on the patterned first electrode material layer to form the first electrode and a respective recess between the side surface of the first electrode and the ferroelectric layer.

16. The method of claim 14, wherein performing the recess etch comprises performing the recess etch on the patterned first electrode material layer, comprising at least one of:
    performing a first recess etch during the patterning of the ferroelectric material layer; or
    performing a second recess etch during the patterning of the second electrode material layer.

17. The method of claim 14, wherein performing the recess etch comprises performing the recess etch on the patterned first electrode material layer, comprising:
    performing the recess etch during the patterning of the second electrode material layer.

18. The method of claim 14, wherein performing the recess etch comprises performing the recess etch on the patterned first electrode material layer, comprising:
    after a formation of the patterned first electrode material layer, the ferroelectric layer, and the second electrode, trimming the mask layer such that a respective recess is formed between a side surface of the mask layer and the side surface of the patterned first electrode material layer; and
    etching, using the trimmed mask layer as an etch mask, the patterned first electrode material layer to remove a portion of the patterned first electrode material layer exposed by the trimmed mask layer.

19. The method of claim 14, wherein performing the recess etch comprises performing the recess etch on each of the patterned first and second electrode material layers at the same time to respectively form the first and second electrodes, wherein a respective recess is between a side surface of each of the first and second electrodes and the side surface of the ferroelectric layer.

* * * * *